US012719459B2

(12) United States Patent
Chakravarthy et al.

(10) Patent No.: US 12,719,459 B2
(45) **Date of Patent: *Aug. 25, 2026**

(54) EMBEDDED PATTERN GENERATOR

(71) Applicant: Texas Instruments Incorporated, Dallas, TX (US)

(72) Inventors: Srinivasa Chakravarthy, Bangalore (IN); Prasanth Viswanathan Pillai, Bangalore (IN); Mohammed Arif, Bangalore (IN); Bhargov Bora, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 18/805,795

(22) Filed: Aug. 15, 2024

(65) Prior Publication Data

US 2024/0405759 A1 Dec. 5, 2024

Related U.S. Application Data

(63) Continuation of application No. 17/849,417, filed on Jun. 24, 2022, now Pat. No. 12,119,826.

(30) Foreign Application Priority Data

Jun. 25, 2021 (IN) ............................ 202141028694

(51) Int. Cl.
*H03K 5/00* (2006.01)
*G06F 1/06* (2006.01)
(Continued)

(52) U.S. Cl.
CPC ........... *H03K 5/00006* (2013.01); *G06F 1/06* (2013.01); *G06F 11/263* (2013.01); *H03K 21/02* (2013.01)

(58) Field of Classification Search
CPC ...... H03K 5/00006; H03K 21/02; G06F 1/06; G06F 11/263
See application file for complete search history.

(56) References Cited

U.S. PATENT DOCUMENTS 10,651,836 B1 * 5/2020 Kale ..................... H03K 23/54
10,707,851 B1 * 7/2020 Song ........................ G06F 1/06
(Continued)

OTHER PUBLICATIONS

T.-L. Lin and S.-J. Chen, "A Platform of Resynthesizing a Clock Architecture Into Power-and-Area Effective Clock Trees," in IEEE Transactions on Computer-Aided Design of Integrated Circuits and Systems, vol. 39, No. 10, pp. 2475-2488, Oct. 2020 (Year: 2020).*

*Primary Examiner* — Cynthia Britt
(74) *Attorney, Agent, or Firm* — Michelle F. Murray; Frank D. Cimino

(57) ABSTRACT

An example apparatus includes multiplexer circuitry configured to couple a communication module to at least one of a data bus input or a test signal; and embedded pattern generator (EPG) circuitry coupled to the multiplexer circuitry, the EPG circuitry including: clock divider circuitry including a plurality of clock outputs, the clock divider circuitry configured to be coupled to an output of a clock, the plurality of clock outputs configured to be of a frequency equal to a division of a frequency of the output of the clock; a multiplexer including a multiplexer output, the multiplexer configured to couple one of the plurality of clock outputs to the multiplexer output; and signal generator circuitry including an input clock, an EPG input, and a plurality of data outputs, the input clock coupled to the multiplexer output, the signal generator circuitry configured to generate a data stream.

20 Claims, 12 Drawing Sheets

(51) Int. Cl.
*G06F 11/263* (2006.01)
*H03K 21/02* (2006.01)

(56) References Cited

U.S. PATENT DOCUMENTS

| | | | | |
|---|---|---|---|---|
| 12,119,826 | B2 * | 10/2024 | Chakravarthy | G06F 1/06 |
| 2003/0014703 | A1 | 1/2003 | Chakravarthy et al. | |
| 2003/0039168 | A1 | 2/2003 | Chan et al. | |
| 2012/0176159 | A1 | 7/2012 | Webb, III et al. | |
| 2012/0176172 | A1 | 7/2012 | Webb, III et al. | |
| 2012/0176174 | A1 | 7/2012 | Webb, III | |
| 2020/0177170 | A1 | 6/2020 | Kale et al. | |
| 2023/0136815 | A1 * | 5/2023 | Whitaker | H03K 19/1737 713/503 |

* cited by examiner

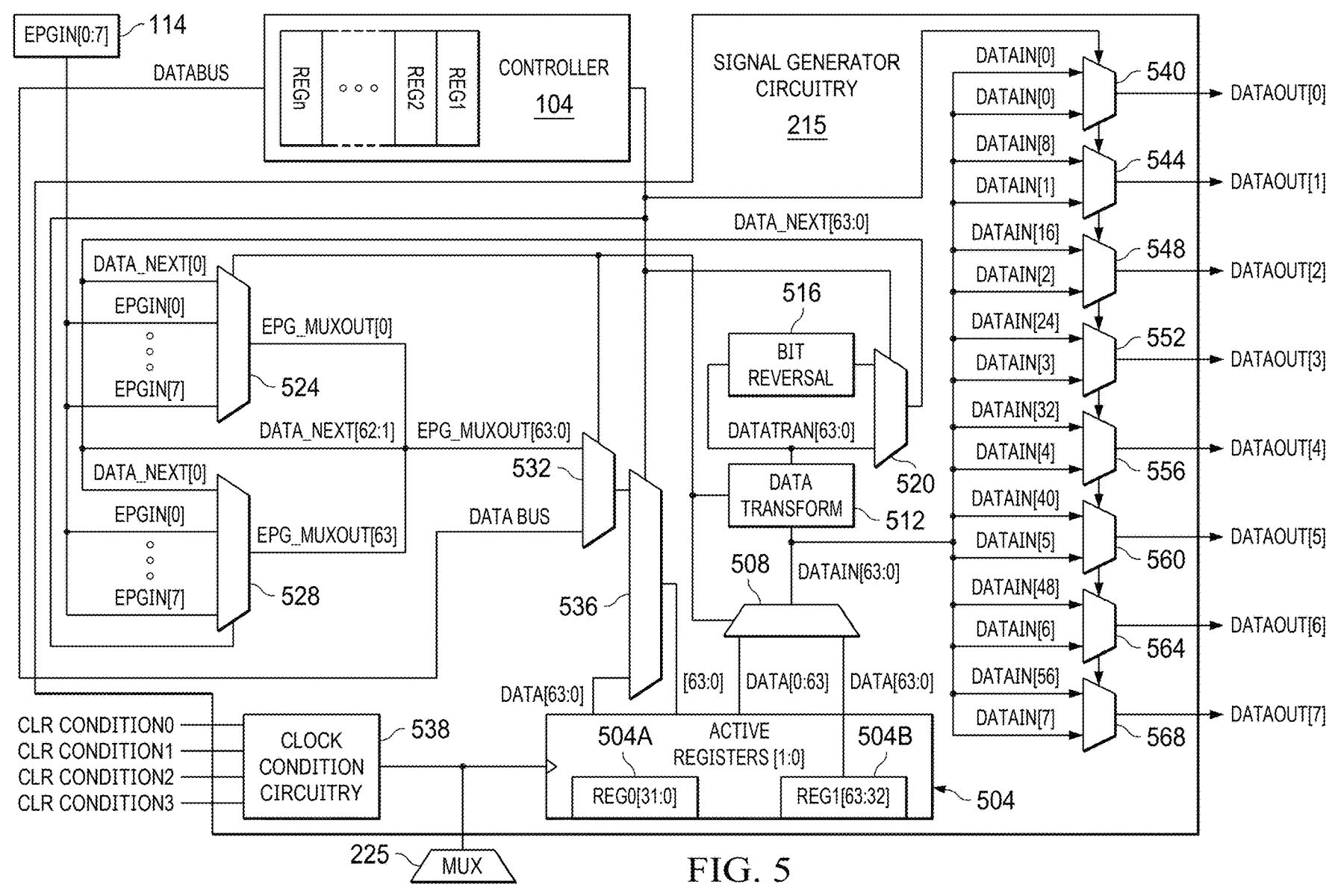

DATAOUT[0]
DATAOUT[1]
DATAOUT[2]
DATAOUT[3]
DATAOUT[4]
DATAOUT[5]
DATAOUT[6]
DATAOUT[7]
540
544
548
552
556
560
564
568
DATAIN[0]
DATAIN[0]
DATAIN[8]
DATAIN[1]
DATAIN[16]
DATAIN[2]
DATAIN[24]
DATAIN[3]
DATAIN[32]
DATAIN[4]
DATAIN[40]
DATAIN[5]
DATAIN[48]
DATAIN[6]
DATAIN[56]
DATAIN[7]
504
SIGNAL GENERATOR CIRCUITRY
215
DATA_NEXT[63:0]
520
512
516
BIT REVERSAL
DATATRAN[63:0]
DATA TRANSFORM
DATAIN[63:0]
508
DATA[63:0]
DATA[0:63]
504B
REG1[63:32]
ACTIVE REGISTERS [1:0]
[63:0]
504A
REG0[31:0]
CONTROLLER
104
REG1
REG2
REGn
EPG_MUXOUT[63:0]
532
DATA BUS
536
DATA[63:0]
DATA[63:0]
MUX
225
538
CLOCK CONDITION CIRCUITRY
EPG_MUXOUT[0]
524
DATA_NEXT[62:1]
EPG_MUXOUT[63]
528
114
DATABUS
EPGIN[0:7]
DATA_NEXT[0]
EPGIN[0]
EPGIN[7]
DATA_NEXT[0]
EPGIN[0]
EPGIN[7]
CLR CONDITION0
CLR CONDITION1
CLR CONDITION2
CLR CONDITION3

FIG. 5

EMBEDDED PATTERN GENERATOR

CROSS-REFERENCE TO RELATED APPLICATIONS

This application is a continuation of U.S. patent application Ser. No. 17/849,417, filed Jun. 24, 2022, which claims priority to India Provisional Patent Application No. 202141028694, filed Jun. 25, 2021, titled "Embedded Pattern Generator for Fast and Efficient," all of which are hereby incorporated herein by reference in their entireties.

TECHNICAL FIELD

This description relates generally to pattern generation, and more particularly to embedded pattern generation for debug and diagnostics of communication circuitry.

BACKGROUND

Microcontroller circuitry may be required to comply with one or more functional safety specifications (e.g., ISO26262 for automotive applications and IEC61508 for industrial applications), which provide guidance on performing diagnostic and/or debugging testing to detect and address hazardous operations of malfunctioning circuitry. Applications, such as communication circuitry, typically perform diagnostic and/or debugging tests using a software based signal generation sequence. Software diagnostics of communication circuitry requires a high precision waveform generator capable of generating sequences that verify operations of the communication circuitry.

SUMMARY

For an embedded pattern generator, an example apparatus includes multiplexer circuitry configured to couple a communication module to at least one of a data bus input or a test signal; and embedded pattern generator (EPG) circuitry coupled to the multiplexer circuitry, the EPG circuitry including: clock divider circuitry including a plurality of clock outputs, the clock divider circuitry configured to be coupled to an output of a clock, the plurality of clock outputs configured to be of a frequency equal to a division of a frequency of the output of the clock; a multiplexer including a multiplexer output, the multiplexer configured to couple one of the plurality of clock outputs to the multiplexer output; and signal generator circuitry including an input clock, an EPG input, and a plurality of data outputs, the input clock coupled to the multiplexer output, the signal generator circuitry configured to generate a data stream.

BRIEF DESCRIPTION OF THE DRAWINGS

FIG. 5 is a schematic diagram showing an example of the signal generator circuitry of FIG. 2.

The same reference numbers or other reference designators are used in the drawings to designate the same or similar (functionally and/or structurally) features.

DETAILED DESCRIPTION

Figure 1:
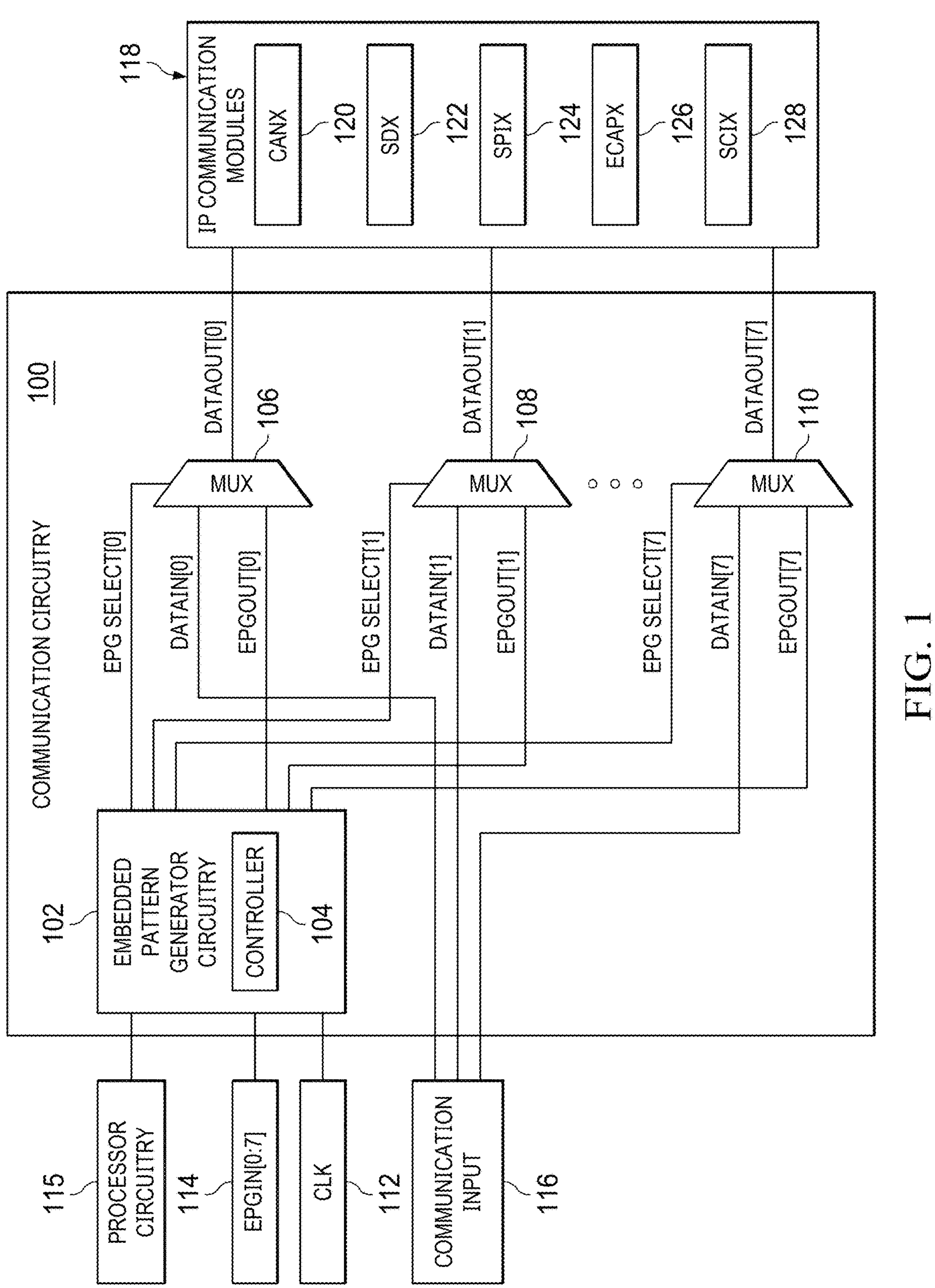
FIG. 1 is a schematic diagram of example communication circuitry including example embedded pattern generator (EPG) circuitry configured to generate a test stimulus signal.

The drawings are not necessarily to scale. Generally, the same reference numbers in the drawing(s) and this description refer to the same or like parts. Although the drawings show layers and regions with clean lines and boundaries, some or all of these lines and/or boundaries may be idealized. In reality, the boundaries and/or lines may be unobservable, blended and/or irregular.

Some applications of communication circuitry may require error handling or advanced software interrupts to occur as a result of receiving a communication indicating an error. For example, communication circuitry may trigger a software sequence to decrease power supplied to a device being monitored by the communication circuitry based on a communication from the device. In such an example, the communication may be an error indication, a value outside of a range of operation, etc. Applications that include circuitry to detect such errors and/or communications may be tested and/or debugged using software applications. Such testing may be based on one or more functional safety specifications (e.g., ISO26262 for automotive applications and IEC61508 for industrial applications), which provide guidance on performing diagnostic and/or debugging testing to ensure safety mechanisms are operational.

Applications, such as microcontroller circuitry, typically perform diagnostic and/or debugging tests using a software based signal generation sequence. For example, a microcontroller may generate a test stimulus, using a software sequence, configured to trigger safety and/or interrupt mechanisms when provided to communication modules. In such an example, the microcontroller may compare the operations of the communication module immediately following the test stimulus is provided to a desired operation to verify that the communication module meets the functional safety specifications. Software debugging of communication circuitry requires high precision waveform generation software capable of generating sequences that when provided to the communication circuitry cause an error and/or trigger an interrupt which enables a safety mechanism. Such software debugging becomes increasingly complex as functional safety specifications are increased.

In some applications, integration complexity of software debugging may be decreased by including hardware components. However, some applications need to include hardware to generate waveforms needed to determine whether circuitry meets the functional safety specifications. For example, a microcontroller may compare raw input/output pin waveforms, independent of protocols, to determine whether an error is caused by board noise and not due to incorrect functional behaviors of communication modules. Even when accompanied with hardware components, software debugging of functional safety specifications becomes increasingly complex and is often limited due to hardware constraints.

The examples described herein include a method and apparatus for embedded pattern generator circuitry capable of generating complex test stimulus using circuitry configured to decrease software complexity to test functional safety specifications. The example embedded pattern generator circuitry, described herein, includes circuitry to generate a plurality of independent clock signals, a plurality of synchronous clock signals, a plurality of independent serial data streams, a skewed clock with respect to a serial data, a synchronous data stream, etc. The clock signals, generated by the embedded pattern generator circuitry, are generated using clock divider circuitry. The clock divider circuitry is hardware circuitry configured to divide an input clock signal to generate a plurality of output clocks based on one or more counter values. The embedded pattern generator circuitry includes a plurality of clock divider circuitry configured with a plurality of divider counter values, such that each of the plurality of output clock may be different divided versions of the input clock signal. The output of the embedded pattern generator circuitry may be one or more of the plurality of output clocks. The embedded pattern generator circuitry may add an offset to the output clock by switching between a first output of a first clock divider circuitry and an output of a second clock divider circuitry, such that the offset may be determined based on a difference between divider counter values of the clock divider circuitries.

The test stimulus (e.g., the skewed clock with respect to the serial data stream, the synchronous data stream, etc.) is a data stream generated by the embedded pattern generator circuitry using the clock divider circuitry and signal generator circuitry. The signal generator circuitry generates the data stream based on a clock signal, generated by the clock divider circuitry, an embedded pattern generator input, and/or settings implemented by a controller. The signal generator circuitry uses data transformations, which are selected by the controller, to generate a test stimulus that is one of a least significant bit first serial data stream, a most significant bit first serial data stream, a clock and data pair, a clock and skewed data pair, a capture of serial data, etc. Advantageously, the clock divider circuitry and signal generator circuitry may be implemented to test and/or debug functional safety specifications by generating test stimulus. Advantageously, an output of the embedded pattern generator circuitry may be selected as a result of controlling multiplexer circuitry to couple one or more of the outputs of the clock divider circuitry and/or signal generator circuitry to a communication module for testing.

FIG. 1 is a schematic diagram of example communication circuitry 100 including example embedded pattern generator (EPG) circuitry 102 configured to generate a test stimulus signal. In the example of FIG. 1, the communication circuitry 100 includes the EPG circuitry 102, an example controller 104, a first example multiplexer 106, a second example multiplexer 108, and a third example multiplexer 110. The communication circuitry 100 is coupled to an example clock 112, an example EPG input 114, example processor circuitry 115, an example communication input 116, and example communication modules 118. The communication circuitry 100 is configured to provide one of a test stimulus or a communication input to the communication modules 118 based on the controller 104 and the multiplexers 106-110. The test stimulus is a signal generated by the EPG circuitry 102 based on the clock 112, the EPG input 114, and/or the controller 104. The communication input is an input signal from circuitry configured to communicate with the communication modules 118 using a pre-determined communication protocol (e.g., controller area network (CAN), serial peripheral interface (SPI), etc.). The communication circuitry 100 supplies the test stimulus to the communication modules 118 to perform debug and/or diagnostic testing, which may be required, to meet functional safety specifications. The communication circuitry 100 supplies the communication input 116 to the communication modules 118 during durations of operation not used for debugging and/or diagnostics. Alternatively, the communication circuitry 100 may be configured to generate a test stimulus signal for debugging non-communication circuitry, such that the communication circuitry 100 may generate a bit bang signal to test operations of circuitry coupled to the communication circuitry 100.

In the example of FIG. 1, the EPG circuitry 102 includes the controller 104. The EPG circuitry 102 is coupled to the multiplexers 106-110, the clock 112, the EPG input 114, and the processor circuitry 115. The EPG circuitry 102 is configured to generate a test stimulus based on inputs from the controller 104, the clock 112, and the EPG input 114. The EPG circuitry 102 is configured to test the communication modules 118 using the test stimulus. Alternatively, the EPG circuitry 102 may be configured to test operations and/or mechanisms of circuitry, which may be tested using software waveform generation methods. The test stimulus is a hardware generated signal configured to test, debug, and/or perform diagnostics of the communication modules 118. The EPG circuitry 102 generates the test stimulus to be one of a modified clock signal (e.g., an independent clock, a synchronous clock, an offset clock, etc.) or a pattern (e.g., serial data stream, synchronous data stream, a data stream skewed with respect to a clock signal, etc.). The test stimulus may be generated based on the controller 104, such that the controller 104 may modify the EPG circuitry 102 to generate a test stimulus to test and/or debug one or more operations of the communication modules 118.

The controller 104 is coupled to the multiplexers 106-110 and the processor circuitry 115. The controller 104 controls the EPG circuitry 102, such that the controller 104 may control characteristics of the EPG circuitry 102 which modify the test stimulus. For example, the controller 104 may control inputs to the EPG circuitry 102 to generate a serial data stream of a known value as the test stimulus. In such an example, the controller 104 may control the EPG circuitry 102 by modifying register values, which are used to determine the test stimulus, such register values may be set or configured by the processor circuitry 115. The controller 104 is configured to control the multiplexers 106-110, such that the controller 104 is coupled to a control input of the multiplexers 106-110. The controller 104 may configure multiplexer circuitry 106-110 to provide the test stimulus or the communications input 116 to the communication modules 118.

The multiplexers 106-110 are coupled to the EPG circuitry 102, the controller 104, the communication input 116, and the communication modules 118. Each of the multiplexers 106-110 are configured to provide one bit to the communication modules 118, such that each of the multiplexers 106-110 couple one bit of the test stimulus or communication input 116 to the communication modules 118. For example, an output of the first multiplexer 106 may be configured to represent a most significant bit and an output of the third multiplexer 110 may be configured to represent a least significant bit. The multiplexers 106-110 include a first input and a second input that are each individually coupled to a corresponding bit of the test stimulus or communication input 116. The respective first inputs of the multiplexers 106-110 are individually coupled to the bits comprising the communications input 116, such that the controller 104 may configure the multiplexers 106-110 to provide the communications input 116 to the communication modules 118 by selecting the respective first inputs of the multiplexers 106-110. The respective second inputs of the multiplexers 106-110 are individually coupled to the bits comprising the test stimulus, generated by the EPG circuitry 102, such that the controller 104 may configure the multiplexers 106-110 to provide the test stimulus to the communication modules 118 by selecting the respective second inputs of the multiplexers 106-110. In the example of FIG. 1, the communication circuitry 100 includes the multiplexers 106-110, however, the communication circuitry 100 may include any plurality of multiplexers to supply a plurality of bits to the communication modules 118. For example, the communication circuitry 100 may include eight multiplexers to supply an eight bit output to the communication module 118. Advantageously, the communication circuitry 100 may be scaled up and/or down to supply any plurality of bits to communication modules 118.

The clock 112 is coupled to the EPG circuitry 102. The clock 112 supplies the EPG circuitry 102 with a clock signal. The clock 112 may be an external oscillator, crystal oscillator, system clock, etc.

The EPG input 114 is coupled to the EPG circuitry 102. The EPG input 114 is a plurality of bits that determine a data value of the test stimulus when the controller 104 configures the EPG circuitry 102 to generate a data stream as the test stimulus. The EPG input 114 may be an eight bit value configured to represent a value which may be tested. For example, the EPG input 114 may be a value representing an error in a device coupled to the communications input 116, such that the test stimulus causes a software and/or hardware interrupt when the multiplexers 106-110 supply the test stimulus to the communication modules 118. The EPG input 114 may be provided by the controller 104, a value stored in a register, an input from a software routine, etc.

The processor circuitry 115 is coupled to the EPG circuitry 102. The processor circuitry 115 configures the operations of the EPG circuitry 102. The processor circuitry may set values of register circuitry included in the EPG circuitry 102. For example, the processor circuitry 115 may set a register value in the controller 104 to cause the EPG circuitry 102 to generate a clock output as the test stimulus. The processor circuitry 115 may be implemented by circuitry discussed in connection with FIG. 13, below.

The communication input 116 is coupled to the multiplexers 106-110. The communications input 116 is an illustrative representation of an interface between the communication circuitry 100 and devices and/or circuitry configured to communicate with the communication modules 118. For example, the communication input 116 may be a plurality of terminals configured to be coupled to an external device (not illustrated), such that the external device uses the communication input 116 to communicate with the communication modules 118.

The communication modules 118 are coupled to the communication circuitry 100, such that outputs of the multiplexers 106-110 are inputs to the communication modules 118. The communication modules 118 may include one or more modules including circuitry to support a communication protocol or method of data capture. The communication modules 118 may include an example controller area network (CAN) communication module 120, an example sigma delta (SD) filter module 122, an example SPI communication module 124, an example enhanced capture (cCAP) module 126, and/or an example serial communications interface (SCI) communication module 128. The modules 120-128 are configured to interface with devices and/or circuitry coupled to the communication input 116. The modules 120-128 may be tested and/or debugged using the test stimulus generated by the EPG circuitry 102. Alternatively, the communication circuitry 100 may generate test stimulus to test or debug circuitry configured to accept a waveform, clock, and/or data stream as an input other than that of the communication modules 118.

In example operation, the controller 104 may test the communication modules 118 by configuring the EPG circuitry 102 to generate a test stimulus signal and configuring the multiplexers 106-110 to couple the respective inputs of the multiplexers 106-110, corresponding to the test stimulus, to the communication modules 118. The controller 104 may be configured to supply the communications input 116 to the communication modules 118 by configuring the multiplexers 106-110 to couple the respective inputs of the multiplexers 106-110, corresponding to the communication inputs 116, to the communication modules 118. Advantageously, the communication modules 118 may be tested and/or debugged by configuring the multiplexers 106-110 to supply a test stimulus, generated by the EPG circuitry 102, to the communication modules 118.

Figure 2:
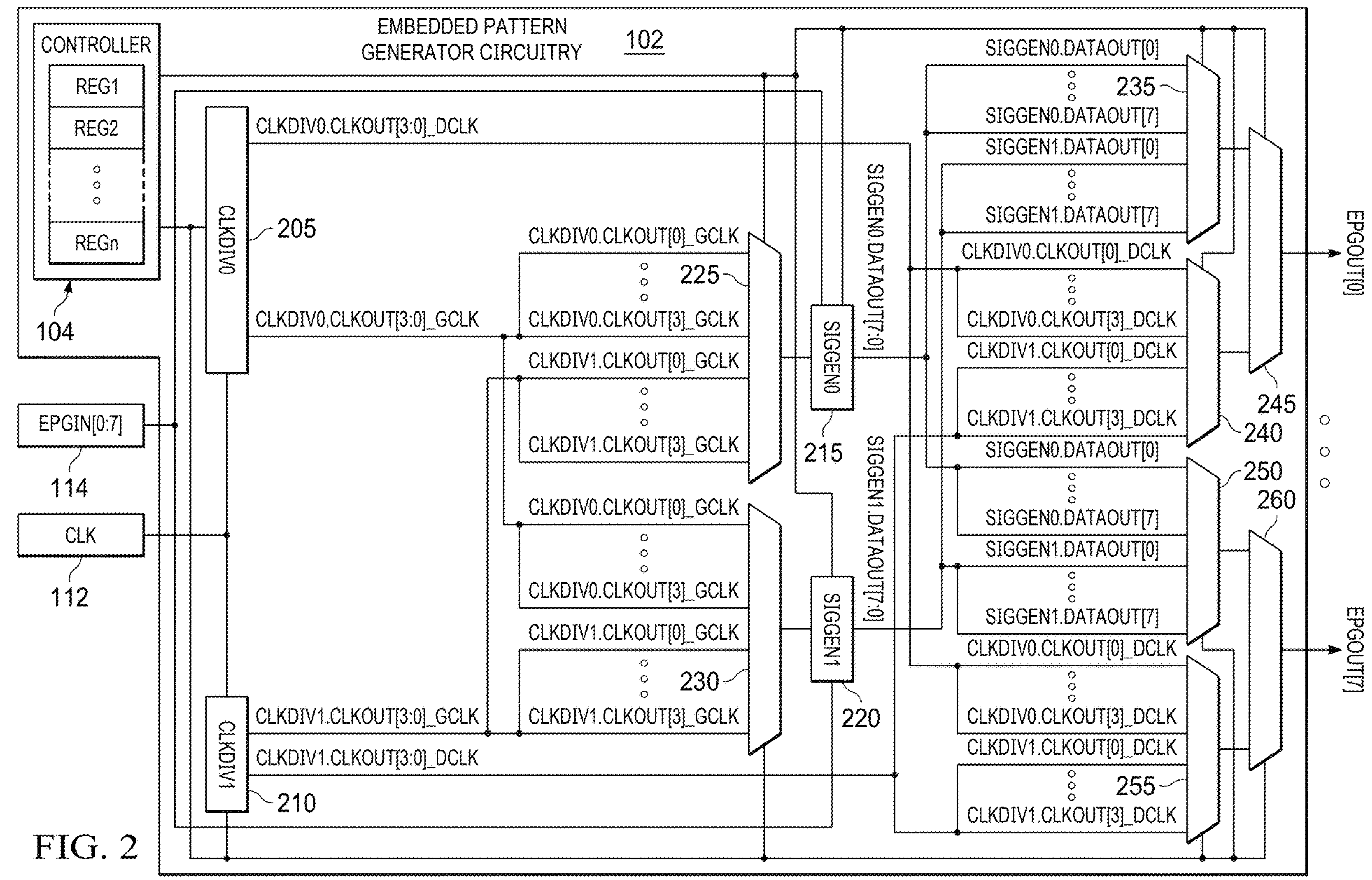
FIG. 2 is a schematic diagram of the EPG circuitry of FIG. 1 including first and second example clock divider circuitry, and first and second example signal generator circuitry, the EPG circuitry configured to generate an EPG output based on an EPG input.

FIG. 2 is a schematic diagram of the EPG circuitry 102 of FIG. 1 including the controller 104 of FIG. 1, a first example clock divider circuitry 205, a second example clock divider circuitry 210, a first example signal generator circuitry 215, and a second signal generator circuitry 220. The EPG circuitry 102 is configured to generate an EPG output (EPGOUT[7:0]) based on the controller 104, the EPG input 114 (EPGIN [7:0]) of FIG. 1, and/or the signal generator circuitry 215 or 220. The EPG circuitry 102 includes the clock divider circuitry 205 and 210, the signal generator circuitry 215 and 220, a first example multiplexer 225, a second example multiplexer 230, a third example multiplexer 235, a fourth example multiplexer 240, a fifth example multiplexer 245, a sixth example multiplexer 250, a seventh example multiplexer 255, and an eighth example multiplexer 260. The EPG circuitry 102 is configured to generate an eight bit output signal, which may be referred to as the test stimulus and/or the EPG output (EPGOUT[7:0]).

In the example of FIG. 2, the clock divider circuitry 205 and 210 are coupled to the controller 104 and the clock 112. The clock divider circuitry 205 and 210 are configured to generate a plurality output clocks which are divided clock signals of the clock signal supplied by the clock 112. The output clocks are of a frequency, corresponding to a division of a frequency of the clock 112. The clock divider circuitry 205 and 210 are configured similar to each other, however, each of the clock divider circuitries 205 and 210 may produce different outputs based on the controller 104. Each of the output clocks, generated by the clock divider circuitry 205 and 210, include a gated clock signal (GCLK) and a fifty percent duty cycle signal (DCLK). For example, the first clock divider circuitry 205 is configured to divide an input from the clock 112 into four separate frequencies, such that the first clock divider circuitry 205 includes eight output clock signals including four gated clock outputs (CLKDIV0.CLKOUT[3:0]_GCLK) and four fifty percent duty cycle clocks (CLKDIV0.CLKOUT[3:0]_DCLK). The gated clock signals, generated by the clock divider circuitry 205 and 210, are individually coupled to respective inputs of the multiplexers 225 and 230, such that the multiplexers 225 and 230 may couple one of the gated clock outputs to a respective multiplexer output of the multiplexers 225 and 230. The fifty percent duty cycle clock signals, generated by the clock divider circuitry 205 and 210, are individually coupled to respective inputs of the multiplexers 240 and 255, such that the multiplexers 240 and 255 may couple one of the fifty percent duty cycle clock signals to a respective output of the multiplexers 240 and 255, such that the test stimulus may be one of the fifty percent duty cycle clock signals. Operations of the clock divider circuitry 205 and 210 are discussed in further detail in connection with FIGS. 3 and 4, below.

The first signal generator circuitry 215 is coupled to the controller 104, the EPG input 114, the first multiplexer 225, the third multiplexer 235, and the sixth multiplexer 250. The second signal generator circuitry 220 is coupled to the controller 104, the EPG input 114, the second multiplexer 230, the third multiplexer 235, and the sixth multiplexer 250. The signal generator circuitry 215 and 220 are configured to generate a plurality of data outputs as a signal based on the controller 104, the EPG input 114, and/or the respective output of one of the multiplexers 225 or 230. The signal generator circuitry 215 and 220 include circuitry to perform a plurality of bit wise operations on a register value to transform the register value, which generates a test stimulus resembling a data stream. For example, the first signal generator circuitry 215 may be configured to left bit shift a register value to simulate a serial data stream. In such an example, the first signal generator circuitry 215 may add a bit of the EPG input 114 to the register value as bits are shifted. Operations of the signal generator circuitry 215 and 220 are discussed in further detail in connection with FIG. 5, below.

The multiplexers 225-260 are configured to be controlled by the controller 104, such that the controller 104 is coupled to a respective control input of each of the multiplexers 225-260. The multiplexers 225 and 230 are configured to supply one or more gated clock signals from the clock divider circuitry 205 and 210 to the signal generator circuitry 215 and 220. The multiplexers 235-245 are configured to determine a least significant bit of the EPG output. The multiplexers 250-260 are configured to determine a most significant bit of the EPG output. In the example of FIG. 2, the multiplexers 235-260 illustrate setting two bits of the EPG output. Alternatively, the EPG circuitry 102 may be modified to include any plurality of multiplexers coupled to the outputs of circuitry 205, 210, 215, and/or 220 to generate an EPG output of a plurality of bits.

Figure 3:
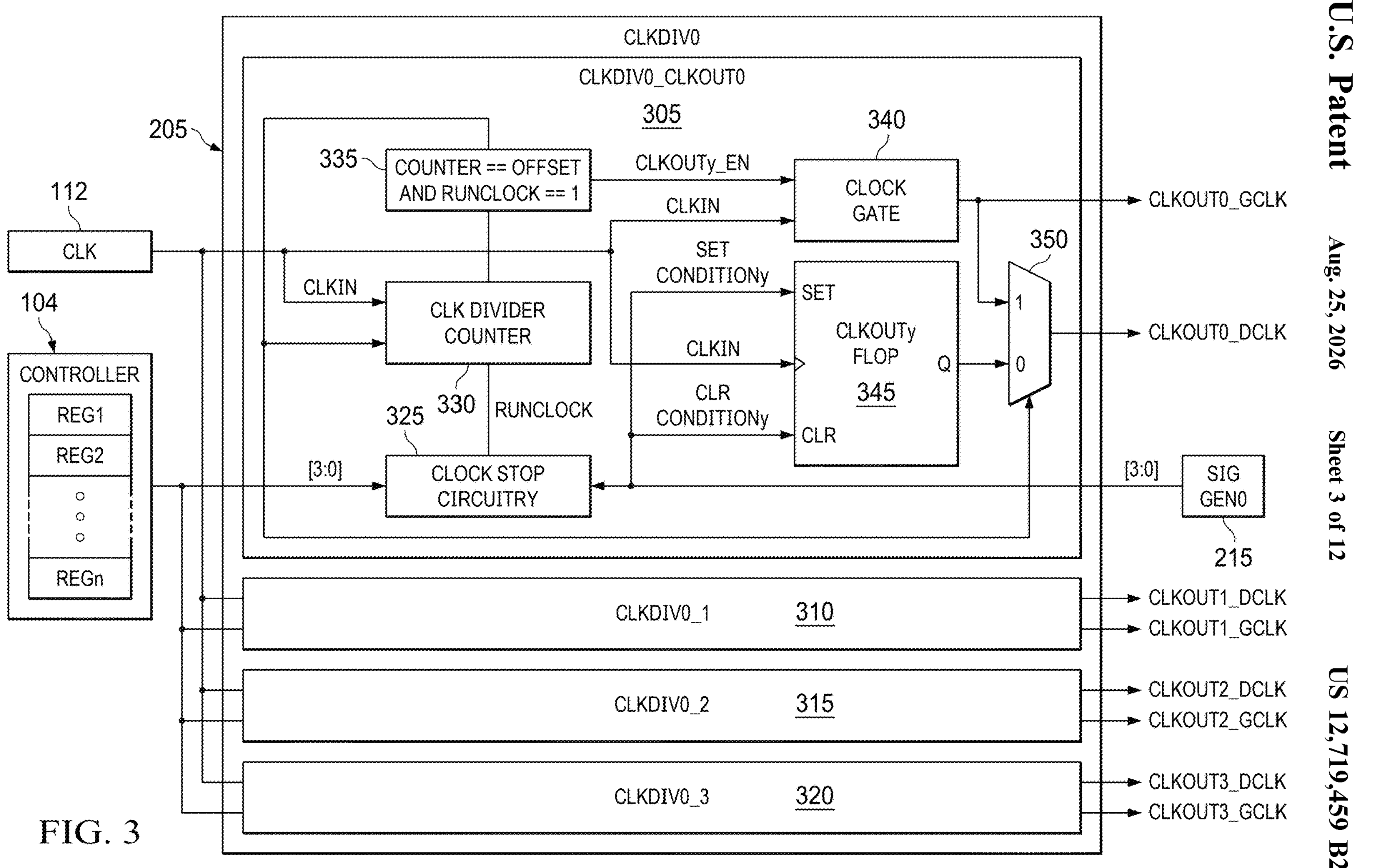
FIG. 3 is a schematic diagram showing an example of the clock divider circuitry of FIG. 2 including clock stop circuitry, the clock divider circuitry configured to generate a divided clock output based on an input clock.

FIG. 3 is a schematic diagram of the first clock divider circuitry 205 of FIG. 2 including a first example clock divider 305, a second example clock divider 310, a third example clock divider 315, and an example fourth clock divider 320. The clock divider circuitry 205 is configured to generate a plurality of output clocks based on the clock 112 of FIGS. 1 and 2. The first clock divider circuitry 205 is configured to generate four clock outputs as divided versions of the clock 112, each of the four clock outputs including a gated clock output (GCLK) and a fifty percent duty cycle clock output (DCLK), such that the first clock divider 305 is configured to generate eight output clocks. The clock dividers 305-320 individually generate two clock outputs. The two clock outputs include a GCLK clock and a DCLK clock.

In the example of FIG. 3, the first clock divider 305 includes example clock stop circuitry 325, an example clock divider counter 330, example digital circuitry 335, example clock gate 340, an example clock output flip-flop 345, and an example multiplexer 350. The first clock divider 305 is configured to divide a clock signal from the clock 112 based on a counter value from the controller 104. The counter value, supplied by the controller 104, may vary between each of the clock dividers 305-320 to generate a plurality of different divided versions of the clock 112, such that the output clocks of the clock dividers 305-320 are of a plurality of frequencies.

Circuitry comprising the clock dividers 310-320 is configured similar to the first clock divider 305, unless otherwise stated. Each of the clock dividers 305-320 are configured to generate both a GCLK and a DCLK clock signal. The clock dividers 305-320 may be configured, by the controller 104, to divide the clock 112 by a different value. For example, the controller 104 may configure the first clock divider 305 to divide the clock 112 by five-hundred pulses and the second clock divider 310 to divide the clock 112 by one-thousand pulses, such that the counter values are five-hundred and one-thousand. In such an example, the clock 112 may supply a one megahertz (MHZ) signal to the first clock divider circuitry 205, which when divided by the clock dividers 305 and 310 generate a two kilohertz (kHz) output (CLKOUT0_GCLK and CLKOUT0_DCLK) of the first clock divider 305 and a one kHz output (CLKOUT1_GCLK and CLKOUT1_DCLK) of the second clock divider 310. Advantageously, the clock divider circuitry 205 may be configured to generate a plurality of individual outputs by configuring the clock dividers 305-320 to divide the clock 112 by different counter values.

Figure 4:
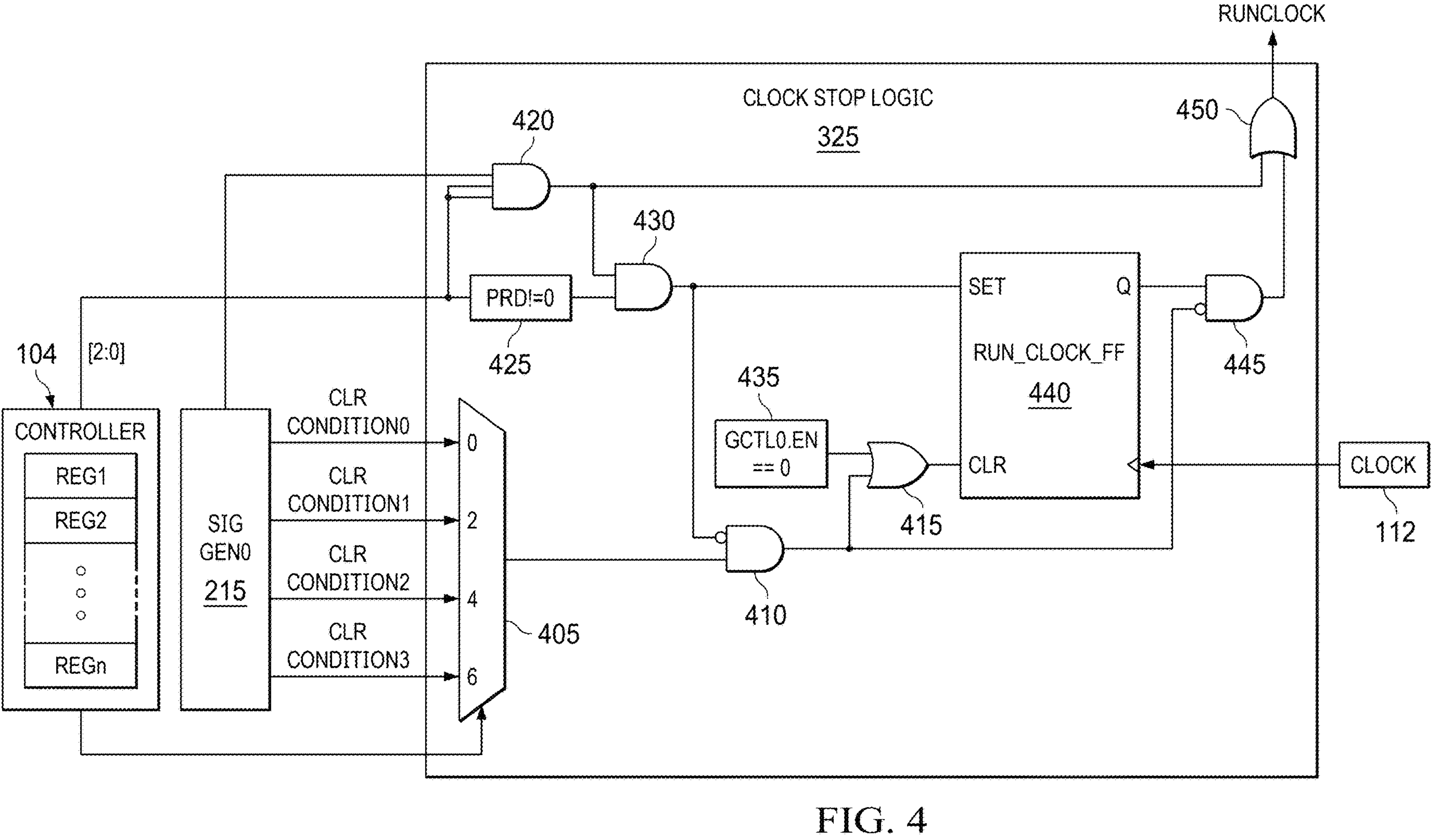
FIG. 4 is a schematic diagram showing an example of the clock stop circuitry of FIG. 3 configured to generate a run clock output.

The clock stop circuitry 325 is coupled to the controller 104, the first signal generator circuitry 215, and the clock divider counter 330. The clock stop circuitry 325 generates an output (RUNCLOCK) to control the clock divider counter 330. For example, the output of the clock stop circuitry 325 may be configured to enable the clock divider counter 330 by setting the output to a logical high (HI) or disable the clock divider counter 330 by setting the output to a logical low (LO). The clock stop circuitry 325 is configured to control the clock divider counter 330 based on inputs from the one of the controller 104 and/or the signal generator circuitry 215 and/or 220. Example of the clock stop circuitry 325 is illustrated in FIG. 4, below.

The clock divider counter 330 is coupled to the controller 104, the clock 112, the clock stop circuitry 325, and the digital circuitry 335. The clock divider counter 330 divides the output of the clock 112 by a counter value. The counter value may be determined by the controller 104, such that a counter input of the clock divider counter 330 is coupled to the controller 104. The clock divider counter 330 outputs a count of a number of pulses of the clock 112 to the digital circuitry 335. The clock divider counter 330 may receive a configuration value from the controller 104 to indicate a period of the clock divider counter 330 or to reset the count. In the example of FIG. 4, the clock divider counter 330 is an example up counter, such that the clock divider counter 330 counts the number of pulses by starting at zero and incrementing by one for each pulse of the clock 112. Alternatively, with slight modifications to the first clock divider 305, the clock divider counter 330 may be a down counter, such that the clock divider counter 330 decrements the count by one, starting at the counter value.

The digital circuitry 335 is coupled to the controller 104, the clock divider counter 330, and the clock gate 340. The digital circuitry 335 compares the counter value from the controller 104 and the count from the clock divider counter 330 to determine whether to enable or disable the clock gate 340. The digital circuitry 335 may offset the count from the clock divider counter 330 by an offset value from the controller 104 to offset or skew the output clocks. The digital circuitry 335 may compare the output (RUNCLOCK) from the clock stop circuitry 325 to determine whether to enable or disable the clock gate 340. For example, the digital circuitry 335 may enable the clock gate 340 to set the gated output of the first clock divider 305 to be approximately equal to the clock 112 for at least one pulse of the clock 112. The digital circuitry 335 may set the count of the clock divider counter 330 to zero and/or the counter value to start a new count value from zero.

The clock gate 340 is coupled to the clock 112 and the digital circuitry 335. The clock gate 340 generates the gated clock output (GCLK) based on the clock 112 and the digital circuitry 335. The gated clock output of the clock gate 340 is approximately equal to the clock 112 based on the comparison of the digital circuitry 335. For example, the gated clock output may be equal to the clock 112 during durations that the count from the clock divider counter 330 and the counter value from the controller 104 are equal. In such an example, the gated clock output may reset as a result of the count of the clock divider counter 330 being reset to zero or the counter value.

The clock output flip-flop 345 is coupled to the clock 112, the first signal generator circuitry 215, and the multiplexer 350. The clock output flip-flop 345 sets an output based on a set condition (SET_CONDITION), from the first signal generator circuitry 215. The clock output flip-flop 345 clears the output based on a clear condition (CLR_CONDITION), from the first signal generator circuitry 215. The first signal generator circuitry 215 generates the set and clear conditions based on the controller 104 and which of the output clocks is to be coupled to the first signal generator circuitry 215. Alternatively, the set and the clear conditions may be generated by the controller 104. Advantageously, the set and/or clear conditions of the clock output flip-flop 345 may be modified to generate a clock signal of a duty cycle. For example, the set and clear conditions may be configured to generate a clock signal of a fifty percent duty cycle. The clock output flip-flop 345 generates the output based on the clock 112, such that the output is set or cleared at an edge (e.g., a rising edge or a falling edge) of a pulse of the clock 112. Advantageously, the output of the clock output flip-flop 345 is a synchronous signal in comparison to the clock 112.

The multiplexer 350 is coupled to the controller 104, the clock gate 340, and the clock output flip-flop 345. The multiplexer 350 may couple one of the gated output of the clock gate 340 or the output of the clock output flip-flop 344 to the fifty percent duty cycle output (DCLK) based on the controller 104. For example, the controller 104 may configure the multiplexer 350 to couple the gated output of the clock gate 340 to an output of the multiplexer 350 by determining that the period of the clock divider counter 330 is equal to zero. In such an example, the controller 104 may configure the multiplexer 350 to couple the output of the clock output flip-flop 345 to an output of the multiplexer 350 by determining that the period of the clock divider counter 330 is not equal to zero. The output of the multiplexer 350 is coupled to the fifty percent duty cycle signal (DCLK), such that the first fifty percent duty cycle signal of the first clock is coupled to the multiplexer 350.

FIG. 4 is a schematic diagram of the clock stop circuitry 325 of FIG. 3 configured to generate a run clock output (RUNCLOCK). The clock stop circuitry 325 generates a run clock output based on the controller 104 of FIGS. 1-3 and the first signal generator circuitry 215 of FIGS. 2 and 3. In the example of FIG. 4, the clock stop circuitry 325 includes an example multiplexer 405, a first example AND gate 410, a first example OR gate 415, a second example AND gate 420, a first example digital logic circuit 425, a third example AND gate 430, a second example digital logic circuit 435, an example flip-flop 440, a fourth example AND gate 445, and a second OR gate 450. The clock stop circuitry 325 generates the run clock output (RUNCLOCK) to enable and disable the clock divider counter 330 of FIG. 3.

In the example of FIG. 4, the multiplexer 405 is coupled to the controller 104, the plurality of inputs from the first signal generator circuitry 215, and the first AND gate 410. The controller 104 controls which respective input of the multiplexer 405 is coupled to the first AND gate 410. The controller 104 configures the multiplexer 405 to couple one of a plurality of clear conditions from the first signal generator circuitry 215 to the first AND gate 410.

The first AND gate 410 is coupled to the multiplexer 405, the first OR gate 415, the third AND gate 430, and the fourth AND gate 445. The first AND gate 410 generates an output based on the clear condition from the multiplexer 405 and an inverse of an output of the third AND gate 430. The first OR gate 415 is coupled to the first AND gate 410, the second digital logic circuit 435, and the flip-flop 440. An output of the first OR gate 415 is based on the output of the first AND gate 410 and the second digital logic circuit 435. The output of the first OR gate 415 is coupled to a clear input of the flip-flop 440.

The second AND gate 420 is coupled to the controller 104, the first signal generator circuitry 215, the third AND gate 430, and the second OR gate 450. An output of the second AND gate 420 is determined based on the controller 104 and the first signal generator circuitry 215. The controller 104 may be configured as an enable, such that a logic high enables the output of the second AND gate 420 to be a logic high based on the first signal generator circuitry 215. The first signal generator circuitry 215 may be configured to enable the output of the second AND gate 420 based on a determination of whether data is present in the first signal generator circuitry 215, such that the output is enabled when data is present. The output of the second AND gate 420 is an input of the third AND gate 430 and an input of the second OR gate 450.

The first digital logic circuit 425 is coupled between the controller 104 and the third AND gate 430. The first digital logic circuit 425 includes circuitry to determine whether the period of the clock divider counter 330 is equal to zero. The period of the clock divider counter 330 may be equal to zero during durations wherein the counter value is zero. An output of the first digital logic circuit 425 may be set to a logic high by determining that the period of the clock divider counter 330, from the controller 104, is not equal to zero and vice versa. The first digital logic circuit 425 may determine the period of the clock divider counter 330 based on an input from the controller 104.

The third AND gate 430 is coupled to the AND gates 410 and 420, the first digital logic circuit 425, and the flip-flop 440. An output of the third AND gate 430 is determined based on the output of the second AND gate 420 and the output of the first digital logic circuit 425. For example, the output of the second AND gate 430 is a logic high as a result of the outputs of the second AND gate 420 and the first digital logic circuit 425 being a logic high. The output of the third AND gate 430 is coupled to a set input of the flip-flop 440, such that the flip-flop 440 is set as a result of the controller 104 enabling the second AND gate 420 and the period of the clock divider counter 330 not being equal to zero.

The second digital logic circuit 435 is coupled to the first OR gate 415 and the flip-flop 440. The second digital logic circuit 435 includes circuitry to determine whether the gated clock output is enabled. For example, the second digital logic circuit 435 may be coupled to the controller 104 to determine whether the gated clock output is enabled. An output of the second digital logic circuit 435 is coupled to the first OR gate 415, such that the output of the first OR gate 415 is equal to a logic high as a result of the second digital logic circuit 435 determining that the gated output is enabled.

The flip-flop 440 is coupled to the clock 112 of FIGS. 1-3, the first OR gate 415, the third AND gate 430, the second digital logic circuit 435, and the fourth AND gate 445. An output of the flip-flop 440 is determined based on inputs from the clock 112, the first OR gate 415, and the third AND gate 430. The output of the flip-flop 440 is set based on the output of the third AND gate 430 and cleared based on the output of the first OR gate 415. The output of the flip-flop 440 is a synchronous signal compared to the clock 112, such that the output is updated on a rising and/or falling edge of the clock 112.

The fourth AND gate 445 is coupled to the first AND gate 410, the flip-flop 440, and the second OR gate 450. An output of the fourth AND gate 445 is determined based on the output of the first AND gate 410 and the output of the flip-flop 440. The fourth AND gate 445 may be configured to perform a logical AND operation of the output of the first AND gate 410 and the output of the flip-flop 440. The second OR gate 450 is coupled to the AND gates 420 and 445. An output of the second OR gate 450 is determined based on the output of the second AND gate 420 and the output of the fourth AND gate 445. The second OR gate 450 may be configured to perform a logical OR operation of the second AND gate 420 and the output of the fourth AND gate 445. The output of the second OR gate 450 is the run clock output of the clock stop circuitry 325.

FIG. 5 is a schematic diagram of the first signal generator circuitry 215 of FIGS. 2-4 is configured to generate an example test signal output. The first signal generator circuitry 215 is coupled to the controller 104 of FIGS. 1-4, the EPG input 114 of FIGS. 1-2, and the first multiplexer 225 of FIG. 2. In the example of FIG. 5, the first signal generator circuitry 215 includes example active register circuitry 504, a first example multiplexer 508, example data transform circuitry 512, example bit reversal circuitry 516, a second example multiplexer 520, a third example multiplexer 524, a fourth example multiplexer 528, a fifth example multiplexer 532, a sixth example multiplexer 536, example clock condition circuitry 538, a seventh example multiplexer 540, an eighth example multiplexer 544, a ninth example multiplexer 548, a tenth example multiplexer 552, a eleventh example multiplexer 556, a twelfth example multiplexer 560, a thirteenth example multiplexer 564, and a fourteenth example multiplexer 568. The first signal generator circuitry 215 generates a data stream output (DATAOUT [0:7]) using the data transformation circuitry 512 to perform bit operations on a register value of the active register circuitry 504.

In the example of FIG. 5, the active register circuitry 504 is coupled to the multiplexers 225, 508, and 536. The active register circuitry 504 includes a first example register 504A and a second example register 504B. The active register circuitry 504 is a sixty-four bit register and representative of a sixty-four bit register value (DATA [63:0]), such that each of the registers 504A and 504B store a thirty-two bit value representative of a register value. The active register circuitry 504 shifts bits from the sixth multiplexer 536 into at least one of the registers 504A and/or 504B, such that the register value of the registers 504A and/or 504B are modified by the sixth multiplexer 536. The active register circuitry 504 uses the output clock from the first multiplexer 225 to shift or update the registers 504A and 504B, such that the output of the first multiplexer 225 coupled to a clock input of the active register circuitry 504. The sixty-four bits comprising the registers 504A and 504B are coupled to the first multiplexer 508.

The first multiplexer 508 is coupled to the controller 104, the active register circuitry 504, the data transform circuitry 512, and the multiplexers 540-568. The multiplexer 508 is configured to couple one of the sixty-four bit register value (DATA [63:0]) or a bit reversed version of the sixty-four bit register value (DATA [0:63]) based on the controller 104. The first multiplexer 508 may couple the sixty-four bit register value to the data transform circuitry 512 and/or the multiplexers 540-568 to output a most significant bit serial data stream. The first multiplexer 508 may couple the bit reversed sixty-four bit value to output a least significant bit serial data stream. A sixty-four bit output (DATAIN[63:0]) of the first multiplexer 508 may additionally be transformed by the data transform circuitry 512.

The data transform circuitry 512 is coupled to the controller 104, the first multiplexer 508, the bit reversal circuitry 516, and the second multiplexer 520. The data transform circuitry 512 transforms the sixty-four bit output of the first multiplexer 508 to a transform output. The transformed output is a sixty-four bit value (DATATRAN [63:0]). The data transform circuitry 512 includes circuitry to couple the output of the first multiplexer 508 to the output of the data transform circuitry 512 based determining that the controller 104 disabled the data transform circuitry 512. The data transform circuitry includes circuitry to bit reverse the output of the first multiplexer 508, left shift the output of the first multiplexer 508, right shift the output of the first multiplexer 508, or rotate the output of the first multiplexer 508. For example, the output of the data transform circuitry 512 may be the sixty-three least significant bits of the output of the first multiplexer 508 and a zero (DATATRAN [63:0]={0, DATAIN[63:1]}) as a result of the controller 104 configuring the data transform circuitry 512 to perform a right bit shift. Advantageously, left and/or right bit shift operations of the data transform circuitry 512 may enable the output of the first signal generator circuitry 215 to replicate a serial data stream.

The data transform circuitry 512 includes circuitry to perform a transform operation determined by the controller 104. The transform operation may be determined based on a mode of operation of the first signal generator circuitry 215, such a mode of operation may be determined and/or set by the controller 104. The mode of operation to be at least one of a bit bang mode, a shift right once mode, a shift right repeat mode, a rotate right once mode, a rotate right repeat mode, a shift left once mode, a shift left repeat mode, a rotate left once mode, or a rotate left repeat mode. The transform operations corresponding to the modes of the data transform circuitry 512 are to perform at least one of a hold operation to hold the value of the first register 504A, an update operation to update the value of the first register 504A based on the EPG input 114, a shift operation to bit shift the value of the first register 504A, or a copy operation to set the value of the first register 504A to the value of the second register 504B. The data transform circuitry 512 may perform the transform operation to either or both of the register values of the registers 504A or 504B.

The bit reversal circuitry 516 is coupled between the data transform circuitry 512 and the second multiplexer 520. The bit reversal circuitry 516 includes circuitry to perform a bit reversal operation on the output of the data transform circuitry 512. An output (DATATRAN [0:63]) of the bit reversal circuitry 516 is coupled to the second multiplexer 520.

The second multiplexer 520 is coupled to the controller 104, the data transform circuitry 512, the bit reversal circuitry 516, and the multiplexers 524-532. The second multiplexer 520 couples one of the output (DATATRAN [63:0]) of the data transform circuitry 512 or the output (DATATRAN [0:63]) of the bit reversal circuitry 516 to the multiplexers 524-532. An output (DATA_NEXT [63:0]) of the second multiplexer 520 is determined based on the controller 104.

The third multiplexer 524 is coupled to the controller 104, the EPG input 114, and the multiplexers 520 and 532. The third multiplexer 524 couples one of the EPG input 114 or the least significant bit of the output (DATA_NEXT [0]) of the second multiplexer 520 to the fifth multiplexer 532. An output (EPG_MUXOUT [0]) of the third multiplexer 524 is determined based on the controller 104. The third multiplexer 524 may be configured to set the least significant bit of the active register circuitry 504 to a bit of the EPG input 114. For example, a first bit (EPGIN [0]) of the EPG input 114 may be the least significant bit of the sixty-four bit value of the active register circuitry 504, such that DATA [0] is equal to EGPIN [0]. In such an example, the third multiplexer 524 may be configured to shift in the EPG input 114 such that a serial data stream output of the first signal generator circuitry 215 are bits comprising the EPG input 114.

The fourth multiplexer 528 is coupled to the controller 104, the EPG input 114, and the multiplexers 520 and 532. The fourth multiplexer 528 couples one of the EPG input 114 or the least significant bit of the output (DATA_NEXT [0]) of the second multiplexer 520 to the fifth multiplexer 532. An output (EPG_MUXOUT [63]) of the fourth multiplexer 528 is determined based on the controller 104. The fourth multiplexer 528 may be configured to set the most significant bit of the active register circuitry 504 to a bit of the EPG input 114. For example, a first bit (EPGIN [0]) of the EPG input 114 may be the most significant bit of the sixty-four bit value of the active register circuitry 504, such that DATA is equal to EGPIN [0]. In such an example, the fourth multiplexer 528 may be configured to shift in the EPG input 114 such that a serial data stream output of the first signal generator circuitry 215 are bits comprising the EPG input 114.

The fifth multiplexer 532 is coupled to the controller 104 and the multiplexers 520-528 and 536. The fifth multiplexer 532 couples one of a plurality of data bus inputs from the controller 104 or a combination of outputs (EPG_MUXOUT [63:0]) of the multiplexers 520-528, such that the combination of outputs of the multiplexers 524 and 528 replace the least and most significant bit of the output (DATA_NEXT [63:0]) of the second multiplexer 520 to generate a transformed data value. The data bus inputs are additional inputs from the controller 104, such that the serial data output of the first signal generator circuitry 215 may be modified. For example, the controller 104 may use the data bus write to provide an error code to the output of the EPG circuitry 102 of FIG. 1. Advantageously, the fifth multiplexer 532 updates the output (DATA_NEXT [63:0]) to include the bits determined by the multiplexers 524 and 528 and enables the controller 104 to set the active register circuitry 504.

The sixth multiplexer 536 is coupled to the controller 104, the active register circuitry 504, and the fifth multiplexers 532. An output of the sixth multiplexer 536 is coupled to one of the value of the active register circuitry 504 or the output of the fifth multiplexer 532. The sixth multiplexer 536 may be controlled based on a determination of whether the registers 504A and 504B are set and a bit count (bit_cnt) of the serial data output of the EPG circuitry 102 is greater than thirty-two. The sixth multiplexer 536 may be controlled based on the controller 104, such that the controller 104 may implement one or more operations to control the sixth multiplexer 536.

The clock condition circuitry 538 is coupled to the first multiplexer 225 and the clock divider 305-320 of FIG. 3. The clock condition circuitry 538 generates a plurality of clear conditions and set conditions for the clock divider circuitry 305-320. The clock condition circuitry 538 is configured to control a clear condition to enable or disable the run clock output of the clock stop circuitry 325 based on the output clock from the first multiplexer 225, such that the output of the first multiplexer 225 coupled to a clock input of the clock condition circuitry 538. The clock condition circuitry 538 is configured to control a set condition to control the duty cycle of the clock generated by the clock output flip-flop 345 of FIG. 3 based on the output clock from the first multiplexer 225.

The multiplexers 540-568 are coupled to the controller 104 and the first multiplexer 508. Inputs of the multiplexers 540-568 are coupled to different bits of the output (DATAIN [63:0]) of the first multiplexer 508. An output (DATAOUT [7:0]) of the multiplexers 540-568 is the output of the first signal generator circuitry 215. The outputs of the multiplexers 540-568 are determined based on whether the first signal generator circuitry 215 is configured to generate a serial data stream in a bit bang mode. For example, the output (DATAOUT [7:0]) of the multiplexer 540-568 may be coupled to the first 8 bits of the output (DATAIN[7:0]) of the first multiplexer 508 during a bit bang mode of operation. The outputs of the multiplexers 540-568 may be coupled to a least significant bit (LSB) of every eight bits (DATAOUT [7:0]={DATAIN[0], DATAIN[8], DATAIN[16], DATAIN [24], DATAIN[32], DATAIN[40], DATAIN[48], DATAIN [56]}) comprising the sixty-four bit register value of the active register circuitry 504, such that the output of the first signal generator circuitry 215 is coupled to a portion of the sixty-four bit register value.

Figure 6:
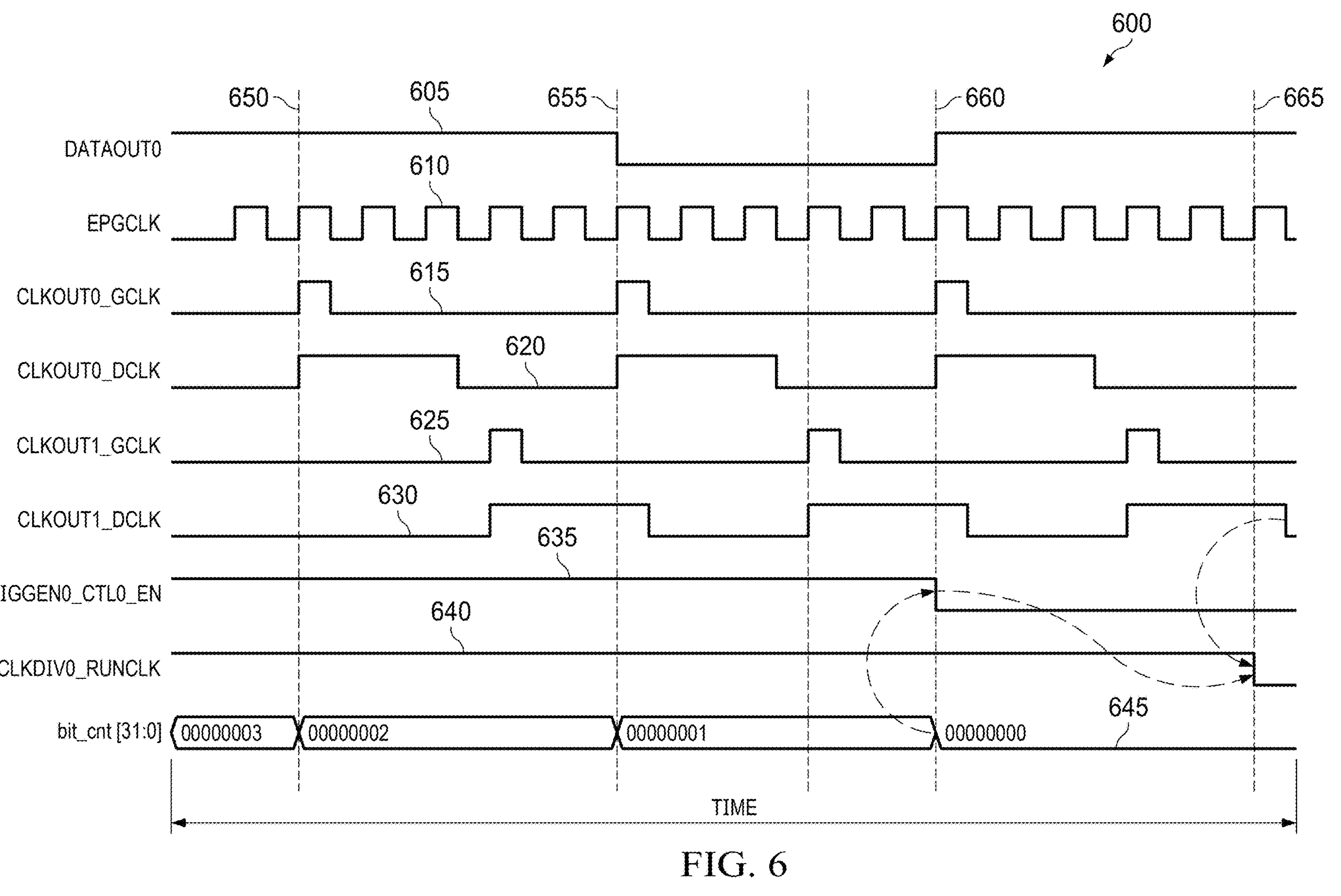
FIG. 6 is an example timing diagram of the divided clock output of FIG. 3 and the run clock output of FIG. 4 generated by the clock stop circuitry of FIGS. 2 and 4.

FIG. 6 is an example timing diagram 600 of the run clock output of FIG. 4 generated by the clock stop circuitry of FIGS. 2 and 4. In the example of FIG. 6, the timing diagram 600 includes an LSB data output signal (DATAOUT0) 605, an example EPG clock signal (EPGCLK) 610, a first example gated clock signal (CLKOUT0_GCLK) 615, a first example fifty percent duty cycle clock signal (CLKOUT0_DCLK) 620, a second example gated clock signal (CLKOUT1_GCLK) 625, a second example fifty percent duty cycle clock signal (CLKOUT1_DCLK) 630, an example signal generator enable signal (SIGGEN0_CTL_EN) 635, an example run clock signal (CLKDIV0_RUNCLK) 640, and an example bit counter (bit_cnt[31:0]) 645. The timing diagram 600 illustrates operations of the first clock divider circuitry 205 of FIGS. 2 and 3.

In the example of FIG. 6, the LSB data output signal 605 is an illustrative example of the LSB of the output (DATAOUT [0]) of the first signal generator circuitry 215 of FIGS. 2 and 5. The EPG clock signal 610 is an illustrative example of the signal provided to the EPG circuitry 102 by the clock 112. The first gated clock signal 615 is an illustrative example of a gated clock signal generated by the first clock divider circuitry 205 of FIGS. 2 and 3. The first fifty percent duty cycle clock signal 620 is an illustrative example of a clock signal, with a fifty percent duty, generated by the first clock divider circuitry 205. In the example of FIG. 6, the clock signals 615 and 620 are illustrative examples of the clock signals produced by the first clock divider 305 of FIG. 3, such that the first gated clock signal 615 is the output of the clock gate 340 of FIG. 3 and the first fifty percent duty cycle clock signal 620 is the output of the multiplexer 350 of FIG. 3. The second gated clock signal 625 is an illustrative example of a gated clock signal generated by the second clock divider 310 of FIG. 3. The second fifty percent duty cycle clock signal 630 is an illustrative example of a clock signal, with a fifty percent duty, generated by the second clock divider 310.

The signal generator enable signal 635 is an illustrative example of a signal produced by the controller 104 to control the data transform circuitry 512 of FIG. 5 of the first signal generator circuitry 215. The signal generator enable signal 635 may be configured to enable the data transform circuitry 512 to modify the output of the first multiplexer 508 of FIG. 5 by setting the signal generator enable signal 635 to a logical high. The data transform circuitry 512 may set the output equal to the input as a result of the signal generator enable signal 635 being set to a logical low. The run clock signal 640 is an illustrative example of the run clock output of the clock stop circuitry 325 of FIGS. 3 and 4. The bit counter 645 is an illustrative example of the count value determined by the clock divider counter 330 of FIG. 3.

At a first time 650, the first gated clock signal 615 is approximately equal to the EPG clock signal 610 for approximately one pulse of the EPG clock signal 610. At the first time 650, the first fifty percent duty cycle clock signal 620 is enabled for approximately fifty percent of the duration of divided clock signal. At a second time 655, the LSB data output signal 605 transitions from a logical high to a logical low to indicate that the least significant bit of the active register circuitry 504 of FIG. 5 is equal to zero. At the second time 655, the LSB data output signal 605 transitions on the rising edge of the clock signals 615 and 620, such that the output of the first signal generator circuitry 215 is synchronous clock signal based on the output of the first clock divider 305.

At a third time 660, the signal generator enable signal 635 transitions from a logical high to a logical low. At the third time 660, the controller 104 may disable the signal generator enable signal 635 as a result of the bit counter 645 being equal to zero, such that a serial data stream output of the first signal generator circuitry 215 has been completely shifted through the active register circuitry 504. At the third time 660, the run clock signal 640 remains enabled to illustrate that the clock stop circuitry 325 may be coupled to a clock signal different from the signal generator circuitry 215.

At a fourth time 665, the run clock signal 640 transitions from a logic high to a logical low as a result of the clock stop circuitry 325 being configured to stop the clock divider counter 330 based on the second fifty percent duty cycle clock signal 630, such that a falling edge of the second fifty percent duty cycle clock signal 630 disables the clock divider counter 330. At the fourth time 665, the run clock signal 640 disables the clock divider counter 330, such that the clock signals 615-630 are a logical low until the run clock signal 640 is a logical high. Advantageously, the clock divider circuitry 205 and 210 of FIG. 2 may be enabled or disabled using the clock stop circuitry 325.

Figure 7:
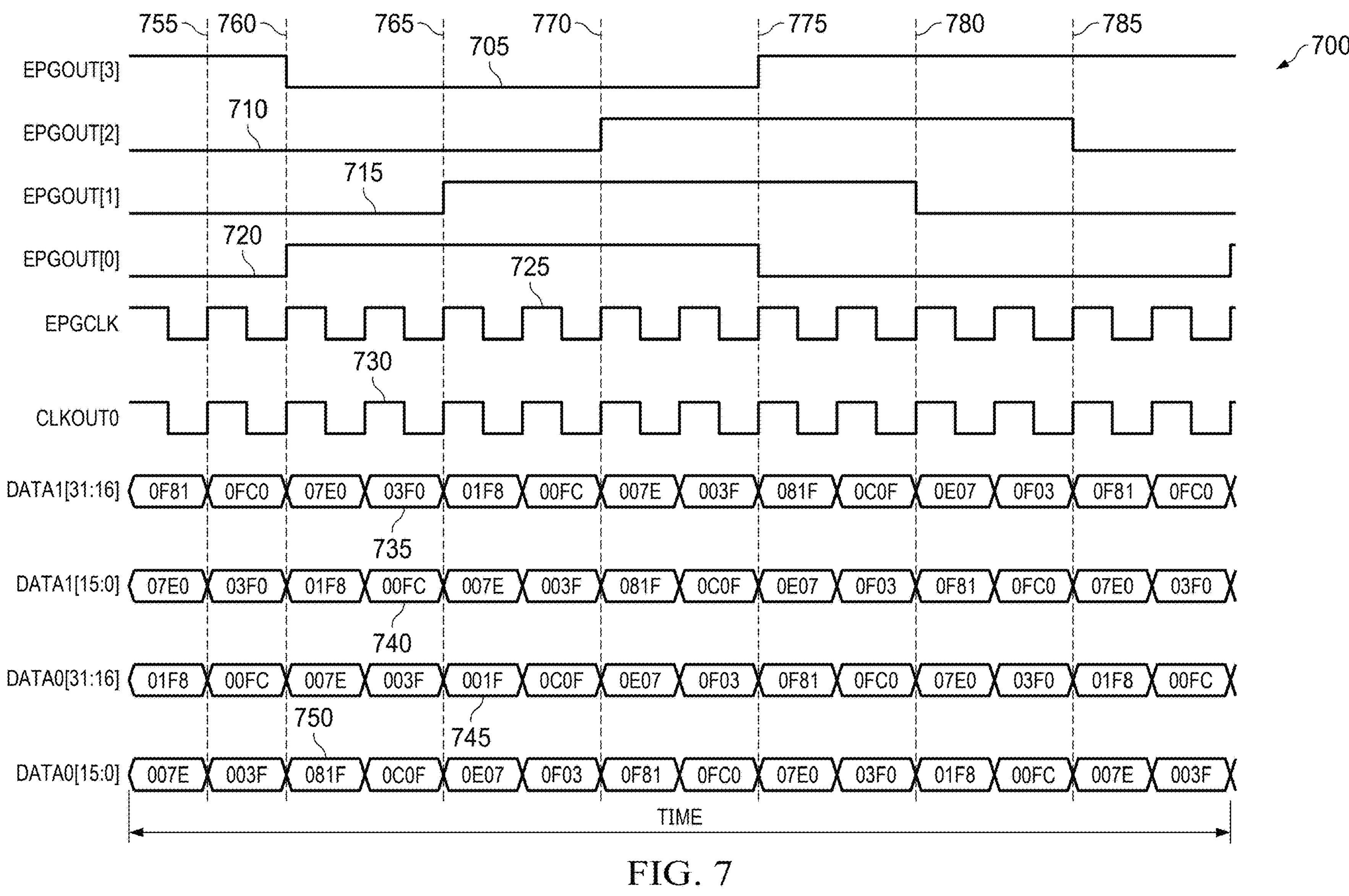
FIG. 7 an example timing diagram of an example operation of the EPG circuitry of FIGS. 1 and 2 configured to generate four individual clock signals, by the clock divider circuitry of FIGS. 2 and 3, which are skewed by two cycles of each other.

FIG. 7 is an example timing diagram 700 of the EPG circuitry 102 of FIGS. 1 and 2 configured to generate four individual clock signals, by the clock divider circuitry of FIGS. 2 and 3, which are skewed by two cycles of each other. In the example of FIG. 7, the timing diagram 700 includes a first example EPG output signal (EPGOUT[3]) 705, a second example EPG output signal (EPGOUT[2]) 710, a third example EPG output signal (EPGOUT[1]) 715, a fourth example EPG output signal (EPGOUT[0]) 720, an example EPG clock signal (EPGCLK) 725, an example clock output signal (CLKOUT0) 730, a first example MSBs register data (DATA1[31:16]) 735, a first example LSBs register data (DATA1[15:0]) 740, a second example MSBs register data (DATA0[31:16]) 745, and a second example LSBs register data (DATA0[15:0]) 750.

In the example of FIG. 7, the EPG output signals 705-720 are illustrative examples of four outputs of the EPG circuitry 102. The EPG output signals 705-720 are illustrative examples of operations of the EPG circuitry 102 which generate four independent synchronous clock signals including different offsets with respect to the EPG clock signal 725. The EPG clock signal 725 is an illustrative example of the signal provided to the EPG circuitry 102 by the clock 112. The clock output signal 730 is an illustrative example of a clock signal generated by the clock divider circuitry 205. The register data 735 and 740 is an illustrative example of a value of the second register 504B of FIG. 5, such that a value of the register data 735 and 740 are equal to the value of the second register 504B. The register data 745 and 750 is an illustrative example of a value of the first register 504A of FIG. 5, such that a value of the register data 745 and 750 are equal to the value of the first register 504A.

At a first time 755, the clock signals 725 and 730 transition from a logical low to a logical high to generate a rising edge, which may correspond to a bit of a serial data stream. At the first time 755, the register data 735-750 is right bit shifted by one bit and the bit added to the MSB of the first MSBs register data 735 is a one. The bit shifted into the active register circuitry 504 may be determined by the controller 104 as a result of selecting one of the bits comprising the EPG input 114 of FIGS. 1, 2, and 5 using the fourth multiplexer 528. Advantageously, the signal generator circuitry 215 and 220 may be configured to bit shift the value of the active register circuitry 504 as a result of a rising edge of the clock 112.

At the first time 755, the least significant bits of each of the data registers 735-745 are equal to zero, such that the EPG outputs 705-715, which correspond to the LSBs of the data registers 735-745, are equal to a logical low at the following rising edge of the clock signals 725 and 730. At the first time 755, the LSB of the second LSBs register data 750 is equal to one, such that the fourth EPG output 720 is to be equal to a logical high at the following rising edge of the clock signals 725 and 730. Advantageously, the EPG outputs 705-720 are configured to be set equal to the LSB of the data registers 735-750 at a rising edge of the clock signal 730, such that the value of the active register circuitry 504 determines the frequency and offset of the EPG outputs 705-720. Advantageously, the EPG outputs 705-720 may be modified as a result of modifying the bits coupled to the multiplexers 540-568 of FIG. 5.

At a second time 760, the fourth EPG output signal 720 transitions from a logical low to a logical high to generate a rising edge based on the LSB of the second LSBs register data 750 being equal to one at the rising edge of the clock signal 730 at the second time. At the second time 760, the register data 735-750 are right bit shifted by one bit and the MSB of the first MSBs register data 735 is zero. At the second time 760, the LSB of the register data 735-745 are zero, such that the EPG outputs 705-715 remain a logical low following the next rising edge of the clock signal 730. At the second time 760, the LSB of the second LSBs register data 750 is one, such that the fourth EPG output 720 remains a logical high following the next rising edge of the clock signal 730. Advantageously, the fourth EPG output 720 remains a logical high until the LSB of the second LSBs register data 750 is equal to a zero.

At a third time 765, the third EPG output signal 715 transitions from a logical low to a logical high to generate a rising edge based on the LSB of the second MSBs register data 745 being equal to one at the rising edge of the clock signal 730 corresponding to the third time 765. At the third time 765, EPG output signals 705 and 710 remain a logical low as a result of the LSB of the register data 735 and 740 being equal to zero at the third time 765.

At a fourth time 770, the second EPG output signal 710 transitions from a logical low to a logical high to generate a rising edge based on the LSB of the first LSBs register data 740 being equal to one at the rising edge of the clock signal 730 corresponding to the fourth time 770. At the fourth time 770, first EPG output signal 705 remains a logical low as a result of the LSB of the first MSBs register data 735 being equal to zero at the fourth time 770.

At a fifth time 775, the first EPG output signal 705 transitions from a logical low to a logical high to generate a rising edge based on the LSB of the first MSBs register data 735 being equal to one at the rising edge of the clock signal 730 corresponding to the fifth time 775. At the fifth time 775, the fourth EPG output signal 720 transitions from a logical high to a logical low to generate a falling edge based on the LSB of the second LSBs register data 750 being equal to zero at the rising edge of the clock signal 730 corresponding to the fifth time 775.

At a sixth time 780, the third EPG output signal 715 transitions from a logical high to a logical low to generate a falling edge based on the LSB of the second MSBs register data 745 being equal to zero at the rising edge of the clock signal 730 corresponding to the sixth time 780. At a seventh time 785, the second EPG output signal 710 transitions from a logical high to a logical low to generate a falling edge based on the LSB of the first LSBs register data 740 being equal to zero at the rising edge of the clock signal 730 corresponding to the seventh time 785.

Advantageously, the period and offset of the EPG outputs 705-720 may be set by configuring the signal generator circuitry 215 and/or 220. For example, the period of the EPG outputs 705-720 is determined based on the consecutive number of one bits comprising the value of the active register circuitry 504, such that a period of six clock cycles corresponds to six one bits followed by six zero bits throughout the value of the active register circuitry 504. In such an example, the controller 104 and/or EPG input 4 configures the fourth multiplexer 528 to shift in a bit as the MSB of the value of the active register circuitry 504 corresponding to the period of six clock cycles. The offset of the EPG outputs 705-720 may be modified as a result of coupling the multiplexers 540-568 to different bits of the value of the active register circuitry 504 or transforming the value of the active register circuitry 504 such that the LSB of the register data 735-750 is equal to a one after a certain amount of clock cycles. Advantageously, the value of the active register circuitry 504 may be set to generate a plurality of synchronous clock outputs.

Figure 8:
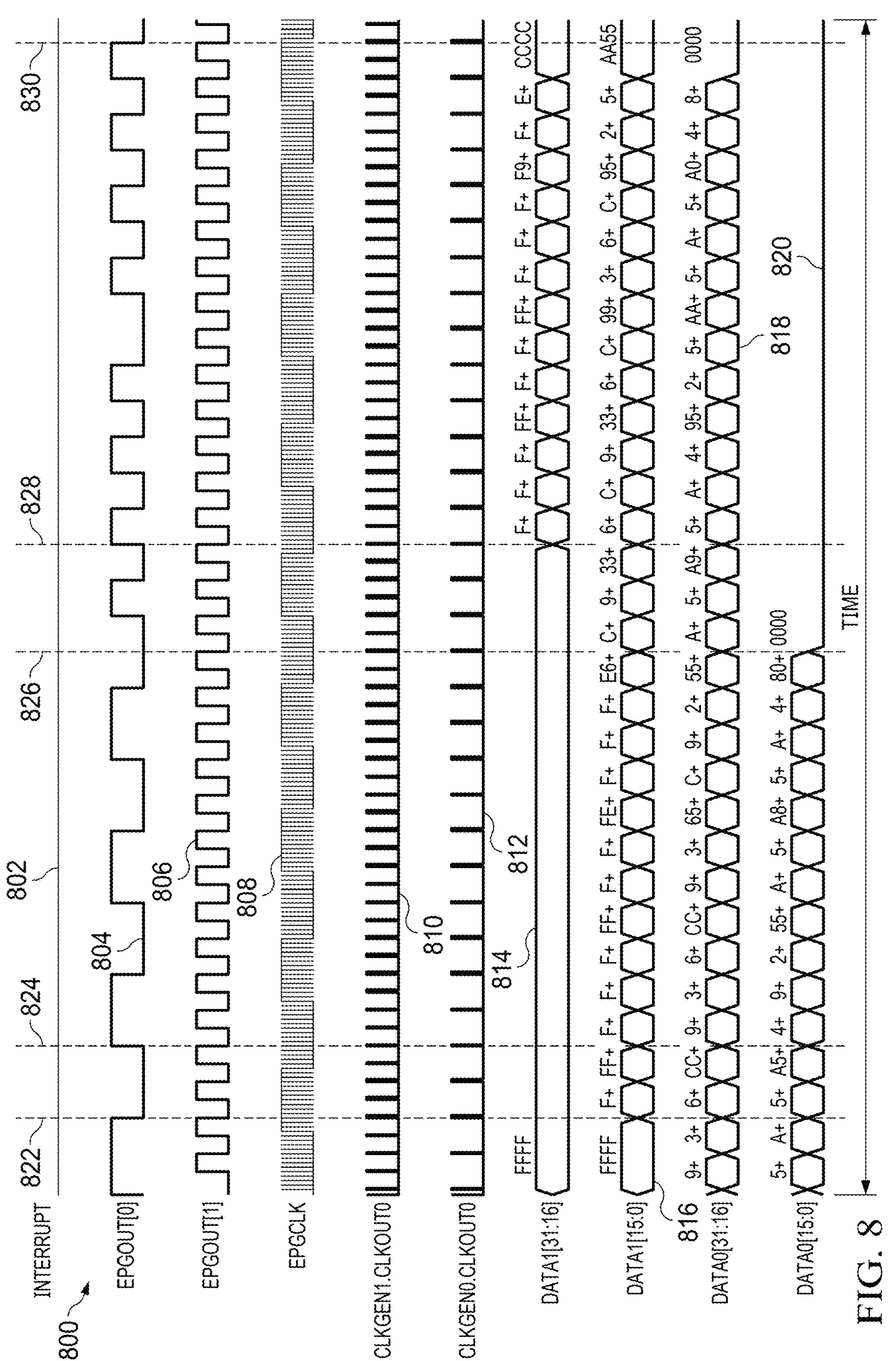
FIG. 8 is an example timing diagram of an example operation of the EPG circuitry of FIGS. 1 and 2 configured to generate a clock and data pair.

FIG. 8 is an example timing diagram 800 of example outputs of the EPG circuitry 102 of FIGS. 1 and 2 configured to generate a clock and data pair. In the example of FIG. 8, the timing diagram 800 includes an example interrupt signal 802, a first example EPG output (EPGOUT[0]) 804, a second example EPG output (EPGOUT[1]) 806, an example EPG clock signal (EPGCLK) 808, a first example clock generator output (CLKGEN1.CLKOUT0) 810, a second example clock generator output (CLKGEN0.CLKOUT0) 812, a first example MSBs register data (DATA1[31:16]) 814, a first example LSBs register data (DATA1[15:0]) 816, a second example MSBs register data (DATA0[31:16]) 818, and a second example LSBs register data (DATA0[15:0]) 820. The timing diagram 800 is an illustrative example of the EPG circuitry 102 configured to shift data based on an associated clock signal.

In the example of FIG. 8, the interrupt signal 802 is an illustrative example of an interrupt signal that is generated as a result of the bits of the value of the active register circuitry 504 of FIG. 5 being shifted thirty-two times. The EPG outputs 804 and 806 are illustrative examples of two outputs of the EPG circuitry 102. The first EPG output 804 is an illustrative example of a data signal to be sampled on the rising edge of a clock signal represented by the second EPG output 806. The EPG clock signal 808 is an illustrative example of the signal provided to the EPG circuitry 102 by the clock 112 of FIGS. 1-3 and 5. The first clock generator output 810 is an illustrative example of a gated clock output of the first clock divider circuitry 205 of FIGS. 2 and 3. The second clock generator output 812 is an illustrative example of a gated clock output of the second clock divider circuitry 210 of FIG. 2. The register data 814 and 816 is an illustrative example of a value of the second register 504B of FIG. 5, such that a value of the register data 814 and 816 are equal to the value of the second register 504B. The register data 818 and 820 is an illustrative example of a value of the first register 504A of FIG. 5, such that a value of the register data 818 and 820 are equal to the value of the first register 504A.

At a first time 822, the first EPG output 804 transitions from a logic high to a logic low to represent a zero bit on the first EPG output 804. In the example of FIG. 8, the first EPG output 804 is configured to be updated at the falling edge of the clock signal generated on the second EPG output 806. At a second time 824, the first EPG output 804 transitions from a logic low to a logic high to represent a one bit on the first EPG output 804. At a third time 826, the first EPG output 804 is a logic low to represent a zero bit on the first EPG output 804. At a fourth time 828, the first EPG output 804 transitions from a logic low to a logic high to represent a one bit on the first EPG output 804. At a fifth time 830, the first EPG output 804 transitions from a logic high to a logic low to represent a zero bit on the first EPG output 804. At the fifth time 830, the interrupt signal 802 is a logical high to indicate that thirty-two bit shift operations were performed.

Advantageously, the EPG circuitry 102 may be configured to couple an output of one of the signal generator circuitry 215 or 220 to a first output of the EPG circuitry 102 and an output of one of the clock divider circuitry 205 or 210 to a second output of the EPG circuitry 102. Advantageously, the EPG circuitry 102 may generate a serial data stream and associated clock as a result of sampling the first output of the EPG circuitry 102 on an edge of the second output of the EPG circuitry 102. Advantageously, a data rate of the serial data stream may be modified as a result of modifying a counter value of the clock divider counter 330 of FIG. 3, such that decreasing the counter value increases the data rate. Advantageously, data comprising the serial data stream generated by the EPG circuitry 102 may be set by modifying the value of the active register circuitry 504.

Figure 9:
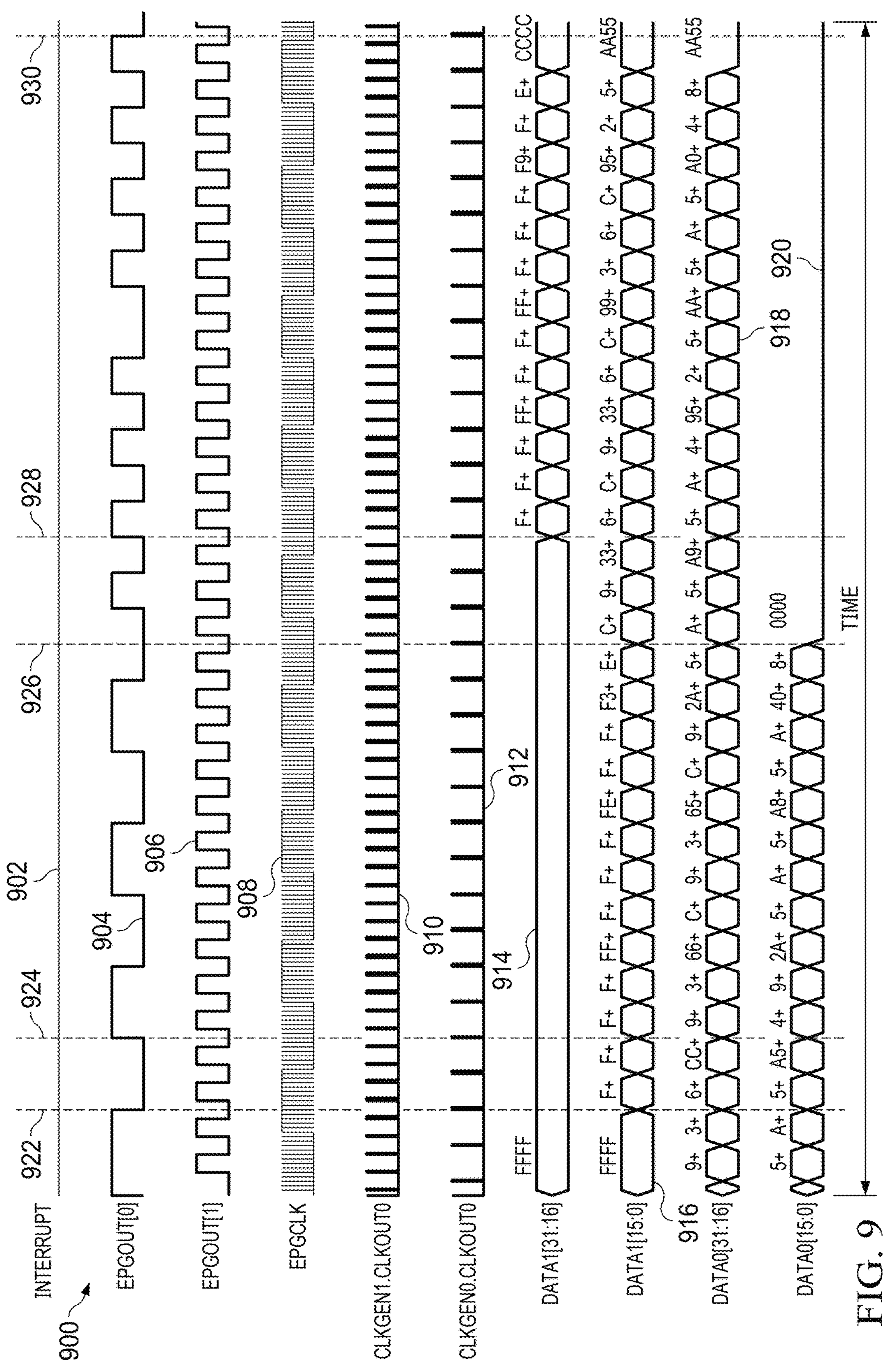
FIG. 9 is an example timing diagram of an example operation of the EPG circuitry of FIGS. 1 and 2 configured to generate a clock and a skewed data pair.

FIG. 9 is an example timing diagram 900 of example outputs of the EPG circuitry 102 of FIGS. 1 and 2 configured to generate a clock signal and a configurable skewed serial data stream. In the example of FIG. 9, the timing diagram 900 includes an example interrupt signal 902, a first example EPG output (EPGOUT[0]) 904, a second example EPG output (EPGOUT[1]) 906, an example EPG clock signal (EPGCLK) 908, a first example clock generator output (CLKGEN1.CLKOUT0) 910, a second example clock generator output (CLKGEN0.CLKOUT0) 912, a first example MSBs register data (DATA1[31:16]) 914, a first example LSBs register data (DATA1[15:0]) 916, a second example MSBs register data (DATA0[31:16]) 918, and a second example LSBs register data (DATA0[15:0]) 920. The timing diagram 900 is an illustrative example of the EPG circuitry 102 configured to shift data based on a skewed clock signal.

In the example of FIG. 9, the interrupt signal 902 is an illustrative example of an interrupt signal that is generated as a result of the bits of the value of the active register circuitry 504 of FIG. 5 being shifted thirty-two times. The EPG outputs 904 and 906 are illustrative examples of two outputs of the EPG circuitry 102. The first EPG output 904 is an illustrative example of a data signal to be sampled on the rising edge of a clock signal represented by the second EPG output 906. The EGP clock signal 908 is an illustrative example of the signal provided to the EPG circuitry 102 by the clock 112 of FIGS. 1-3 and 5. The first clock generator output 910 is an illustrative example of a gated clock output of the first clock divider circuitry 205 of FIGS. 2 and 3. The second clock generator output 912 is an illustrative example of a gated clock output of the second clock divider circuitry 210 of FIG. 2. The register data 914 and 916 is an illustrative example of a value of the second register 504B of FIG. 5, such that a value of the register data 914 and 916 are equal to the value of the second register 504B. The register data 918 and 920 is an illustrative example of a value of the first register 504A of FIG. 5, such that a value of the register data 918 and 920 are equal to the value of the first register 504A.

At a first time 922, the first EPG output 904 transitions from a logic high to a logic low to represent a zero bit on the first EPG output 904. In the example of FIG. 9, the first EPG output 904 is configured to be updated at the rising edge of the second clock generator output 912, such that the clock signal of the second EPG output 906 may be offset by a plurality of cycles of the EPG clock signal 808. At a second time 924, the first EPG output 904 transitions from a logic low to a logic high to represent a one bit on the first EPG output 904. At a third time 926, the first EPG output 904 is a logic low to represent a zero bit on the first EPG output 904. At a fourth time 928, the first EPG output 904 transitions from a logic low to a logic high to represent a one bit on the first EPG output 904. At a fifth time 830, the first EPG output 904 transitions from a logic high to a logic low to represent a zero bit on the first EPG output 904. At the fifth time 930, the interrupt signal 902 is a logical high to indicate that thirty-two bit shift operations were performed. Advantageously, the clock signal of the second EPG output 906 may be skewed without effecting the sampling of a serial data stream of the first EPG output 904, such that a skewed serial data stream may be generated by the EPG circuitry 102.

Figure 10:
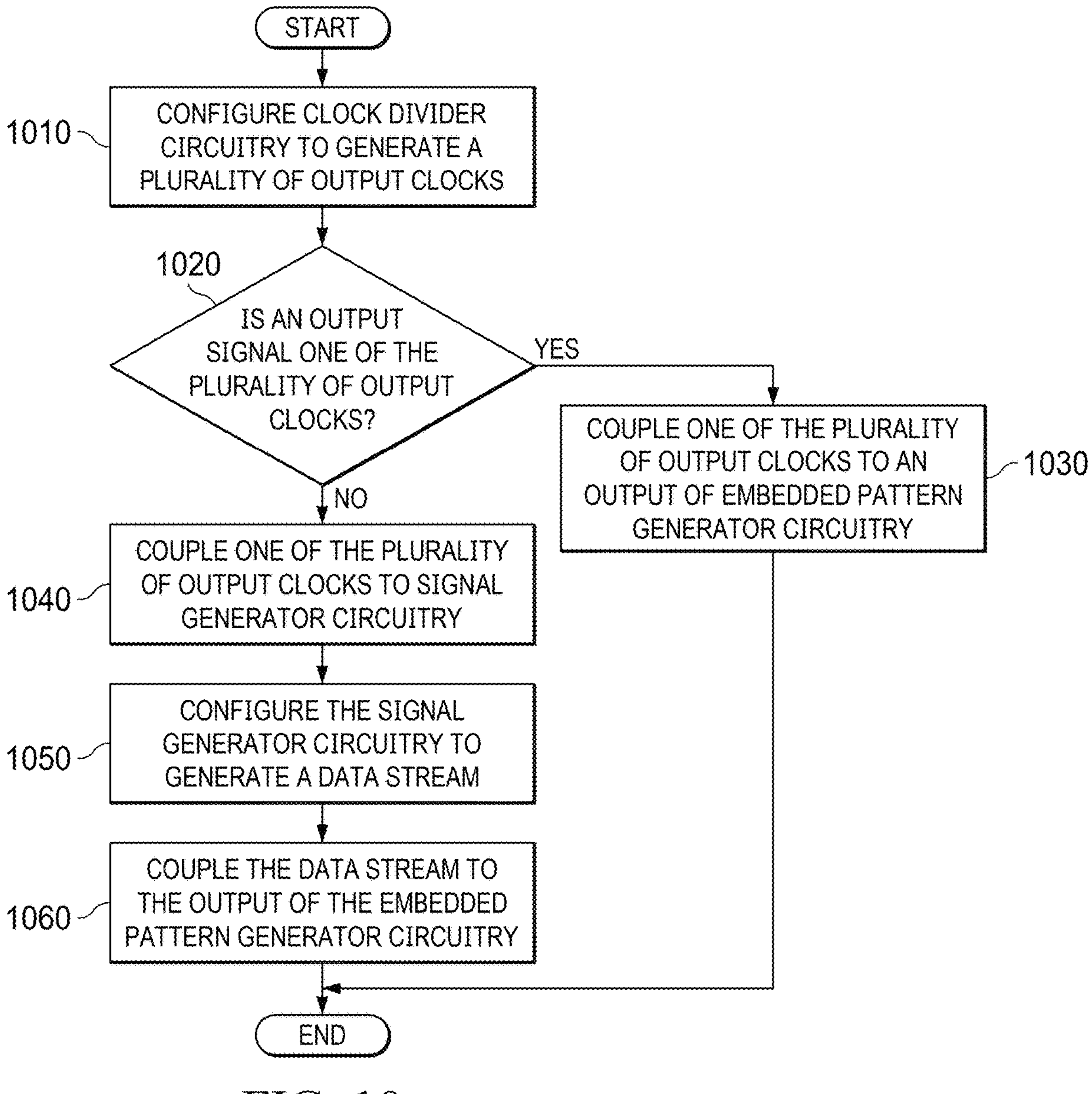
FIG. 10 is a flowchart representative of example machine readable instructions and/or example operations that may be executed by example processor circuitry to implement the EPG circuitry of FIGS. 1 and 2.

FIG. 10 is a flowchart representative of example machine readable instructions and/or example operations that may be executed by example processor circuitry to implement the EPG circuitry 102 of FIGS. 1 and 2. The process begins at block 1010. At block 1010, the controller 104 of FIGS. 1-5 configures the clock divider circuitry 205 or 210 of FIGS. 2 and 3 to generate a plurality of output clocks (CLKOUT [3:0]_GCLK and CLKOUT [3:0]_GCLK and). The controller 104 sets a counter value and/or an offset value for each of the clock dividers 305-320 of FIG. 3. The controller 104 may enable the clock divider circuitry 205 or 210 to generate the output clocks by enabling the clock stop circuitry 325 of FIGS. 3 and 4. The controller 104 may enable one or more of the clock dividers 305-320 to generate one or more output clocks. Block 1010 is described in connection with FIG. 11, below. The controller 104 proceeds to block 1020.

At block 1020, the controller 104 determines whether an output signal (EPGOUT [7:0]) of the EPG circuitry 102 is to couple one or more of the plurality of output clocks to the output of the EPG circuitry 102. For example, the controller 104 may couple one of the output clocks of the clock divider circuitry 205 to the output of the EPG circuitry 102 to supply the one of the output clocks to the communication modules 118 of FIG. 1. The controller 104 proceeds to block 1030 as a result of determining that the output signal of the EPG circuitry 102 is one of the output clocks of the clock divider circuitry 205 or 210. The controller 104 may determine couple the output of the signal generator circuitry 215 or 220 as a result of determining that the output of the EPG circuitry 102 is a data stream. The controller 104 proceeds to block 1040 as a result of determining that the output signal of the EPG circuitry 102 is not one of the output clocks.

At block 1030, the controller 104 couples one of the plurality of output clocks, generated by the clock divider circuitry 205 or 210, to the output of the EPG circuitry 102. For example, the controller 104 may configure the multiplexers 235-260 of FIG. 2 to couple one or more of the output clocks of the clock divider circuitry 205 or 210 to one or more of the outputs of the EPG circuitry 102. The controller 104 proceeds to end, such that a test stimulus generated by the EPG circuitry 102 is an output clock.

At block 1040, the controller 104 couples one of the plurality of output clocks, generated by the clock divider circuitry 205 or 210, to the signal generator circuitry 215 or 220. For example, the controller 104 may configure one or the multiplexers 225 or 230 to couple one of the plurality of output clocks to an input of the signal generator circuitry 215 or 220. The controller 104 proceeds to block 1050.

At block 1050, the controller 104 configures the signal generator circuitry 215 and/or 220 to generate a data stream. The controller 104 determines a mode of operation of the signal generator circuitry 215 or 220 by configuring an operation of the data transform circuitry 512 of FIG. 5 and/or the multiplexers 520-536. The data transform circuitry 512 may be configured for one of a bit bang mode, a shift right once mode, a shift right repeat mode, a rotate right once mode, a rotate right repeat mode, a shift left once mode, a shift left repeat mode, a rotate left once mode, or a rotate left repeat mode. For example, the controller 104 may configure the signal generator circuitry 215 and/or 220 to generate a data stream by left or right shifting the value of the registers 504A and 504B and configuring at least one of the multiplexers 524 and/or 528 to replace the MSB and/or LSB of the value of the registers 504A and 504B. Block 1050 is described in connection with FIG. 12, below. The controller 104 proceeds to block 1060.

At block 1060, the controller 104 couples the data stream, generated by the signal generator circuitry 215 and/or 220, to the output of the EPG circuitry 102. For example, the controller 104 may configure the multiplexers 235-260 to couple the output of the signal generator circuitry 215 and/or 220 to one or more of the outputs of the EPG circuitry 102. The controller 104 proceeds to end the operations of FIG. 10.

Although example methods are described with reference to the flowchart illustrated in FIG. 10, many other methods of configuring the EPG circuitry 10 may alternatively be used in accordance with this description. For example, the order of execution of the blocks may be changed, and/or some of the blocks described may be changed, eliminated, or combined. Similarly, additional operations may be included in the manufacturing process before, in between, or after the blocks shown in the illustrated examples.

Figure 11:
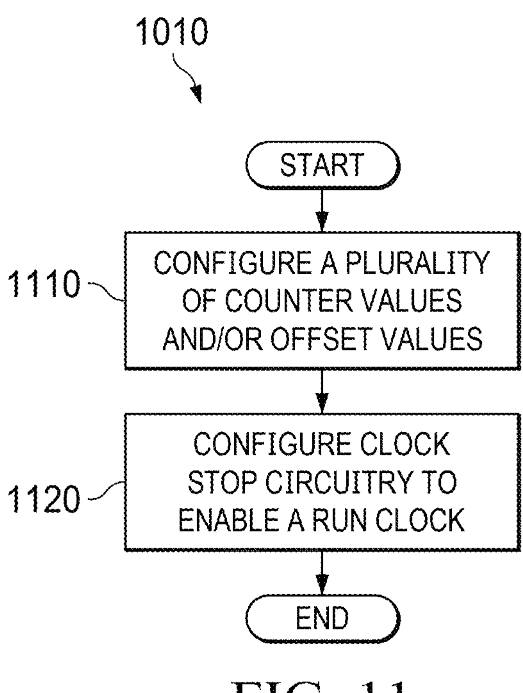
FIG. 11 is a flowchart representative of example machine readable instructions and/or example operations that may be executed by example processor circuitry to implement the clock divider circuitry of FIGS. 2 and 3.

FIG. 11 is a flowchart representative of example machine readable instructions and/or example operations that may be executed by example processor circuitry to implement the clock divider circuitry 205 and 210 of FIGS. 2 and 3. The controller 104 of FIGS. 1-5 begins operations to configure the clock divider circuitry 205 or 210 to generate a plurality of output clocks (block 1010 of FIG. 10) at block 1110. At block 1110, the controller 104 configures a plurality of counter values and/or offset values of one or more of the clock dividers 305-320 of FIG. 3. For example, the controller 104 may configure the clock divider counter 330 of FIG. 3 and/or the digital circuitry 335 of FIG. 3 to count a number of pulses of the clock 112 of FIGS. 1-4 to a counter value. The controller 104 may configure the counter values of the clock dividers 305-320 to generate a plurality of different clock outputs. The controller 104 may set an offset value of the digital circuitry 335 to offset the counter value of the clock divider 305 by a number of cycles of the clock 112 corresponding to the offset value. The controller 104 proceeds to block 1120.

At block 1120, the controller 104 configures the clock stop circuitry 325 of FIGS. 3 and 4 to enable a run clock. For example, the controller 104 may enable the output of the clock stop circuitry 325 to generate a run clock output to enable the clock divider counter 330. The controller 104 proceeds to end the operations of FIG. 11.

Although example methods are described with reference to the flowchart illustrated in FIG. 10, many other methods of configuring the EPG circuitry 10 may alternatively be used in accordance with this description. For example, the order of execution of the blocks may be changed, and/or some of the blocks described may be changed, eliminated, or combined. Similarly, additional operations may be included in the manufacturing process before, in between, or after the blocks shown in the illustrated examples.

Figure 12:
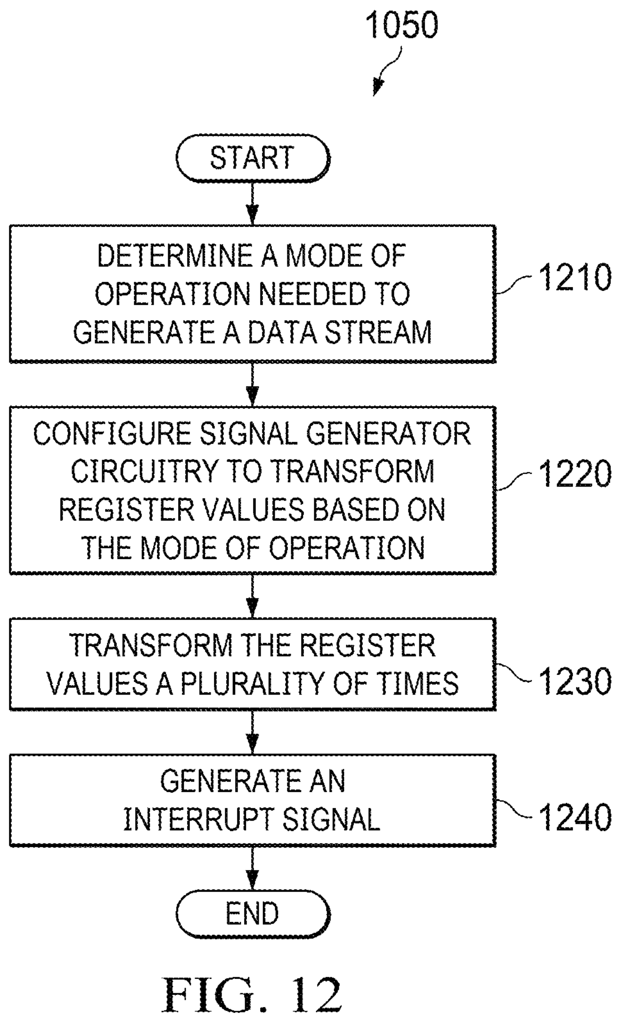
FIG. 12 is a flowchart representative of example machine readable instructions and/or example operations that may be executed by example processor circuitry to implement the signal generator circuitry of FIGS. 2 and 5.

FIG. 12 is a flowchart representative of example machine readable instructions and/or example operations that may be executed by example processor circuitry to implement the signal generator circuitry 215 and 220 of FIGS. 2 and 5. The controller 104 of FIGS. 1-5 begins operations to configure the signal generator circuitry 215 or 220 to generate a data stream (block 1050 of FIG. 10) at block 1210. At block 1210, the controller 104 determines a mode of operation needed to generate a data stream. The controller 104 determines a mode of operation of the signal generator circuitry 215 or 220 by configuring an operation of the data transform circuitry 512 of FIG. 5 and/or the multiplexers 520-536 of FIG. 5. The data transform circuitry 512 may be configured for one of a bit bang mode, a shift right once mode, a shift right repeat mode, a rotate right once mode, a rotate right repeat mode, a shift left once mode, a shift left repeat mode, a rotate left once mode, or a rotate left repeat mode. For example, the controller 104 may configure the signal generator circuitry 215 and/or 220 to generate a data stream by left or right shifting the value of the registers 504A and 504B and configuring at least one of the multiplexers 524 and/or 528 to replace the MSB and/or LSB of the value of the registers 504A and 504B. The controller 104 proceeds to block 1220.

At block 1220, the controller 104 configures the signal generator circuitry 215 and/or 220 to transform values of the registers 504A and 504B of FIG. 5 based on the mode of operation determined at block 1210. For example, the data transform circuitry 512 may perform a left or right bit shift operation as a result of the data transform circuitry 512 being configured for a left or right shift mode. The controller 104 proceeds to block 1230.

At block 1230, the controller 104 transforms the values of the registers 504A and 504B a plurality of times. For example, the controller 104 may perform the operations of the data transform circuitry 512 thirty-two times, corresponding to a thirty-two bit data stream output. The controller 104 proceeds to block 1240.

At block 1240, the controller 104 generates an interrupt signal to indicate a completion of the operations of the data transform circuitry 512 corresponding to an end of the data stream. For example, the controller 104 may be configured to generate a hardware interrupt to the processor circuitry 115 of FIG. 1. The controller 104 proceeds to end the operations of FIG. 12.

Although example methods are described with reference to the flowchart illustrated in FIG. 12, many other methods of configuring the EPG circuitry 102 may alternatively be used in accordance with this description. For example, the order of execution of the blocks may be changed, and/or some of the blocks described may be changed, eliminated, or combined. Similarly, additional operations may be included in the manufacturing process before, in between, or after the blocks shown in the illustrated examples.

Figure 13:
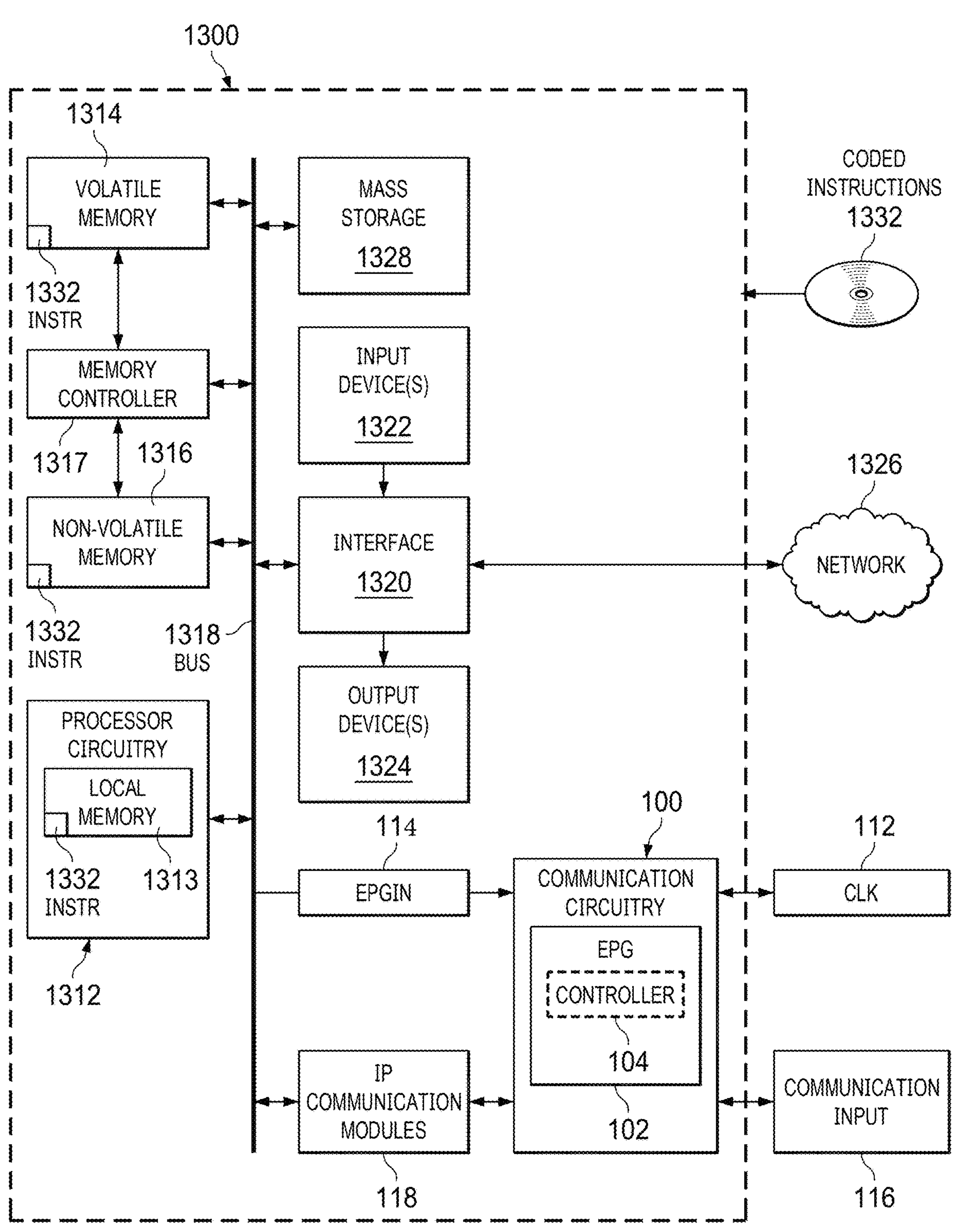
FIG. 13 is a block diagram of an example processing platform including processor circuitry structured to execute the example machine readable instructions to implement the EPG of FIG. 2.

FIG. 13 is a block diagram of an example processing platform including processor circuitry structured to execute the example machine readable instructions and/or the example operations of FIGS. 10-12 to implement the EPG circuitry 102 of FIGS. 1 and 2. The processor platform 1300 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing device.

The processor platform 1300 of the illustrated example includes processor circuitry 1312. The processor circuitry 1312 of the illustrated example is hardware. For example, the processor circuitry 1312 can be implemented by one or more integrated circuits, logic circuits, FPGAs, microprocessors, CPUs, GPUs, DSPs, and/or microcontrollers from any desired family or manufacturer. The processor circuitry 1312 may be implemented by one or more semiconductor based (e.g., silicon based) devices. In this example, the processor circuitry 1312 implements operations of the controller 104 of FIGS. 1-5 to control the EPG circuitry 102 of FIGS. 1 and 2.

The processor circuitry 1312 of the illustrated example includes a local memory 1313 (e.g., a cache, registers, etc.). The processor circuitry 1312 of the illustrated example is in communication with a main memory including a volatile memory 1314 and a non-volatile memory 1316 by a bus 1318. The volatile memory 1314 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1316 may be implemented by flash memory and/or any other desired type of memory device. Access to the main memory 1314, 1316 of the illustrated example is controlled by a memory controller 1317.

The processor platform 1300 of the illustrated example also includes interface circuitry 1320. The interface circuitry 1320 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 1322 are connected to the interface circuitry 1320. The input device(s) 1322 permit(s) a user to enter data and/or commands into the processor circuitry 1312. The input device(s) 1322 can be implemented by, for example, an audio sensor, a microphone, a camera (still or video), a keyboard, a button, a mouse, a touchscreen, a track-pad, a trackball, an isopoint device, and/or a voice recognition system.

One or more output devices 1324 are also connected to the interface circuitry 1320 of the illustrated example. The output device(s) 1324 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 1320 of the illustrated example, thus, typically includes a graphics driver card, a graphics driver chip, and/or graphics processor circuitry such as a GPU.

The interface circuitry 1320 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1326. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 1300 of the illustrated example also includes one or more mass storage devices 1328 to store software and/or data. Examples of such mass storage devices 1328 include magnetic storage devices, optical storage devices, floppy disk drives, HDDs, CDs, Blu-ray disk drives, redundant array of independent disks (RAID) systems, solid state storage devices such as flash memory devices and/or SSDs, and DVD drives.

The machine readable instructions 1332 may be implement the operations of the controller 104 to generate the timing diagrams of FIGS. 6-9, such instructions may be stored in the mass storage device 1328, in the volatile memory 1314, in the non-volatile memory 1316, and/or on a removable non-transitory computer readable storage medium such as a CD or DVD.

In this description, the term "and/or" (when used in a form such as A, B and/or C) refers to any combination or subset of A, B, C, such as: (a) A alone; (b) B alone; (c) C alone; (d) A with B; (c) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications are possible in the described embodiments, and other embodiments are possible, within the scope of the claims.

What is claimed is:

1. A device, comprising:
a circuit comprising:
a set of clock divider circuits, each configured to:
receive an input clock signal; and
generate a respective output clock signal based on dividing the input clock signal by a respective value;
a multiplexer configured to:
receive the output clock signals from the set of clock divider circuits; and
select one of the output clock signals as an output of the multiplexer; and
a signal generator circuit configured to:
receive the output of the multiplexer and an embedded pattern generator (EPG) input value; and
generate a first data stream based on the output of the multiplexer and the EPG input value.

2. The device of claim 1, further comprising:
a controller configured to control the multiplexer to determine which one of the output clock signals to be selected as the output of the multiplexer.

3. The device of claim 1, wherein the EPG input value includes a plurality of bits, and wherein the signal generator circuit is configured to store the plurality of bits in one or more registers of the signal generator circuit.

4. The device of claim 3, wherein the signal generator circuit is configured to perform a transform operation on the plurality of bits to generate a transformed plurality of bits.

5. The device of claim 4, wherein the transform operation includes left shifting the plurality of bits, right shifting the plurality of bits, or rotating the plurality of bits.

6. The device of claim 4, wherein the signal generator circuit is configured to perform a bit reversal operation on the transformed plurality of bits.

7. The device of claim 1, further comprising:
communication circuitry,
wherein the circuit is configured to:
receive a second data stream; and
provide the first data stream or the second data stream to the communication circuitry.

8. The device of claim 7, wherein the circuit is configured to provide the first data stream to the communication circuitry based on a determination to perform a test of the communication circuitry.

9. The device of claim 7, wherein the circuit is configured to provide the second data stream to the communication circuitry based on a determination to operate the communication circuitry for a non-test operation.

10. The device of claim 7, wherein the communication circuitry includes one or more of: controller area network (CAN) communication circuitry, sigma delta (SD) filter circuitry, serial peripheral interface (SPI) communication circuitry, enhanced capture (eCAP) circuitry, or serial communications interface (SCI) communication circuitry.

11. The device of claim 10, wherein the first data stream includes a pattern compatible with the CAN communication circuitry, the SD filter circuitry, the SPI circuitry, the eCAP circuitry, or the SCI communication circuitry.

12. A method, comprising:
receiving an input clock signal;
generating a set of output clock signals, wherein each of the set of output clock signals is generated based on dividing the input clock signal by a respective value;
selecting one of the set of output clock signals;
receiving an embedded pattern generator (EPG) input value; and
generating a first data stream based on the selected output clock signal and the EPG input value.

13. The method of claim 12, wherein the EPG input value includes a plurality of bits.

14. The method of claim 13, wherein generating the first data stream comprises performing a transform operation on the plurality of bits to generate a transformed plurality of bits.

15. The method of claim 14, wherein the transform operation includes left shifting the plurality of bits, right shifting the plurality of bits, or rotating the plurality of bits.

16. The method of claim 14, wherein generating the first data stream comprises performing a bit reversal operation on the transformed plurality of bits.

17. The method of claim 12, further comprising:
receiving a second data stream; and
providing the first data stream or the second data stream to a circuit.

18. The method of claim 17, wherein providing the first data stream or the second data stream to the circuit comprises providing the first data stream to the circuit based on determining to perform a test of the circuit.

19. The method of claim 17, wherein providing the first data stream or the second data stream to the circuit comprises providing the second data stream to the circuit based on determining to operate the circuit for a non-test operation.

20. The method of claim 17, wherein the circuit includes one or more of: controller area network (CAN) communication circuitry, sigma delta (SD) filter circuitry, serial peripheral interface (SPI) communication circuitry, enhanced capture (eCAP) circuitry, or serial communications interface (SCI) communication circuitry.

* * * * *